United States Patent [19]
Kunita et al.

[11] Patent Number: 6,083,658
[45] Date of Patent: Jul. 4, 2000

[54] NEGATIVE WORKING IMAGE RECORDING MATERIAL

[75] Inventors: Kazuto Kunita; Keitaro Aoshima; Ippei Nakamura; Tatsuo Nakamura, all of Shizuoka-ken, Japan

[73] Assignee: Fuji Photo Film Co., Ltd., Minami-Ashigara, Japan

[21] Appl. No.: 09/062,643

[22] Filed: Apr. 20, 1998

[30] Foreign Application Priority Data

Apr. 21, 1997 [JP] Japan ..................................... 9-103647

[51] Int. Cl.$^7$ ................................................... G03C 1/492
[52] U.S. Cl. ........................................ 430/270.1; 430/927
[58] Field of Search ................................. 430/270.1, 927, 430/944

[56] References Cited

U.S. PATENT DOCUMENTS

| | | | |
|---|---|---|---|
| 4,404,272 | 9/1983 | Stahlhofen | 430/192 |
| 5,306,595 | 4/1994 | Scheler et al. | 430/191 |
| 5,372,907 | 12/1994 | Haley et al. | 430/157 |
| 5,648,196 | 7/1997 | Frechet et al. | 430/270.1 |

FOREIGN PATENT DOCUMENTS

| | | | |
|---|---|---|---|
| 0436174 | 7/1991 | European Pat. Off. | G03F 7/039 |
| 0780239 | 6/1997 | European Pat. Off. | B41M 5/36 |
| 8-276558 | 10/1996 | Japan | G03F 7/00 |

OTHER PUBLICATIONS

Database WPI, Section Ch, Week 9701, Derwent Publications Ltd., London, GB; Class A89, AN 97–006906 XP002072312 & JP 08276558A (Fuji Photo Film Co. Ltd.) *Abstract* Oct. 1996.

H. Sachdev et al, "New Negative Tone Resists for Subhalf Micron Lithography", Microelectronic Engineering, vol. 23, No. 1/4, Jan. 1994, Amsterdam, pp. 321–326.

M. Ueda et al, New Negative–Type Photosensitive Polyimide Based on Poly(hydroxyimide), a Cross–Linker, and a Photoacid Generator, Macromolecules, vol. 29, 1996, pp. 6427–6431.

*Primary Examiner*—Janet Baxter
*Assistant Examiner*—Rosemary Ashton
*Attorney, Agent, or Firm*—Burns, Doane, Swecker & Mathis, LLP

[57] ABSTRACT

The negative working image recording image recording material of the present invention is a negative working image recording material comprising (A) a compound which acts as a cross-linking agent in the presence of an acid, (B) a binder polymer, (C) a compound which generates an acid by the action of heat and (D) an infrared absorber, wherein (A) the compound which acts as a cross-linking agent in the presence of an acid is a phenol derivative represented by the following general formula (I) or (II) wherein each of the groups is defined and wherein (B) the binder polymer is a polymer having in the side chain an aromatic hydrocarbon ring having directly linked thereto a hydroxyl group or an alkoxy group if (A) is a phenol derivative represented by the general formula (I), but (B) the binder polymer is a polymer having in the main chain or the side chain an aromatic hydrocarbon ring having directly linked thereto a hydroxyl group or an alkoxy group if (A) is a phenol derivative represented by the general formula (II).

General formula (I)

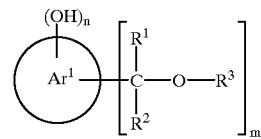

General formula (II)

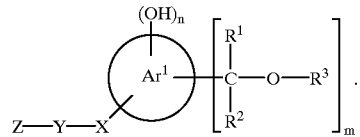

19 Claims, No Drawings

NEGATIVE WORKING IMAGE RECORDING MATERIAL

BACKGROUND OF THE INVENTION

1. Field of the Invention

The present invention relates to an image recording material which can be used as a material for a lithographic printing plate, a color proof, a photoresist or a color filter. More specifically, the present invention relates to a negative working image recording material capable of being used for the preparation of a lithographic printing plate by a direct plate making process in which the material is scanned with an infrared laser according to digital signals from a computer or the like.

2. Description of the Related Art

Recently, because of high output power despite their small sizes, a solid laser and a semiconductor laser, which emit infrared rays in the wavelength range of from 760 to 1200 nm, are attracting attention as a recording light source in platemaking directly from digital data of a computer. However, since the sensitive wavelengths of many practical photosensitive recording materials are in a visible light range of 760 nm or less, the above-mentioned infrared laser cannot be used for image recording. Accordingly, there is a demand for an image recording material which can be recorded by means of an infrared laser.

An example of the image recording materials which can be recorded by such an infrared laser is the recording material which is described in U.S. Pat. (hereinafter abbreviated as "US" on occasion) No. 4,708,925 and which comprises an onium salt, a phenolic resin and a spectral sensitizer. This recording material, however, is a positive-working image recording material utilizing an interaction between the onium salt component and the phenolic resin component so that the interaction makes these components insoluble in a developing solution.

On the other hand, an example of a negative working image recording material is described in Japanese Patent Application Laid-open (JP-A) No. 8-276,558. This recording material comprises a substance which absorbs light to generate heat, an alkali-soluble resin and a specific phenol derivative which has 4–8 benzene rings in the molecule. The image recording mechanism is as follows: the substance, which absorbs light to generate heat, converts the light of a laser into a thermal energy and the thus generated thermal energy activates the specific phenol derivative and enables the phenol derivative to act as an initiator of the cross-linking reaction of the alkali-soluble resin so that the alkali-soluble resin is hardened. The drawback of this recording material is that a high-power laser is necessary so as to carry out desired image recording, because the sensitivity of the recording material to a laser is insufficient from the standpoint of energy conversion efficiency.

SUMMARY OF THE INVENTION

Accordingly, the object of the present invention is to provide a negative working image recording material which is capable of being used for the preparation of a lithographic printing plate by a direct plate making process wherein recording is performed directly from digital data of a computer or the like by means of a solid laser or a semiconductor laser emitting infrared rays and which has a high sensitivity to a laser.

The present inventors have studied the components of a negative working image recording material and have achieved the present invention based on the discovery that the objective can be achieved by using a phenol derivative having a specific functional group as a cross-linking agent in combination with a suitable binder polymer.

That is, the negative working image recording material of the first aspect of the invention is a negative working recording material comprising (A) a compound which acts as a cross-linking agent in the presence of an acid, (B) a binder polymer, (C) a compound which generates an acid by the action of heat and (D) an infrared absorber, wherein (A) the compound which acts as a cross-linking agent in the presence of an acid is a phenol derivative represented by the following general formula (I) and (B) the binder polymer is a polymer having as a side chain an aromatic hydrocarbon ring having directly linked thereto a hydroxyl group or an alkoxy group.

General formula (I)

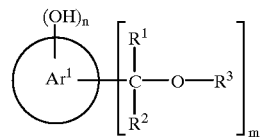

In the general formula (I), $Ar^1$ represents an aromatic hydrocarbon ring which may bear a substituent group; $R^1$ and $R^2$ may be the same or different and each represents a hydrogen atom or a hydrocarbon group having 12 or less carbon atoms; $R^3$ represents a hydrogen atom or a hydrocarbon group having 12 or less carbon atoms; m is an integer of 2 to 4; and n is an integer of 1 to 3.

Further, the negative working image recording material of the second aspect of the invention is a negative working recording material comprising (A) a compound which acts as a cross-linking agent in the presence of an acid, (B) a binder polymer, (C) a compound which generates an acid by the action of heat and (D) an infrared absorber, wherein (A)the compound which acts as a cross-linking agent by in the presence of an acid is a phenol derivative represented by the following general formula (II) and (B) the binder polymer is a polymer having as a side chain or a main chain an aromatic hydrocarbon ring having directly linked thereto a hydroxyl group or an alkoxy group.

General formula (II)

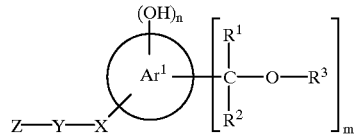

In the general formula (II) $Ar^1$ represents an aromatic hydrocarbon ring which may bear a substituent group; $R^1$ and $R^2$ may be the same or different and each represent a hydrogen atom or a hydrocarbon group having 12 or less carbon atoms; $R^3$ represents a hydrogen atom or a hydrocarbon group having 12 or less carbon atoms; m is an integer of 2 to 4; n is an integer of 1 to 3; X represents a divalent linking group; Y represents a mono to quadravalent linking group or a hydrogen-ended terminal group each having a partial structure selected from the partial structures given below; and Z represents a mono to quadravalent linking group or a functional group which is present in accordance with the number of groups represented by Y with the proviso that Z is absent if Y is a terminal group:

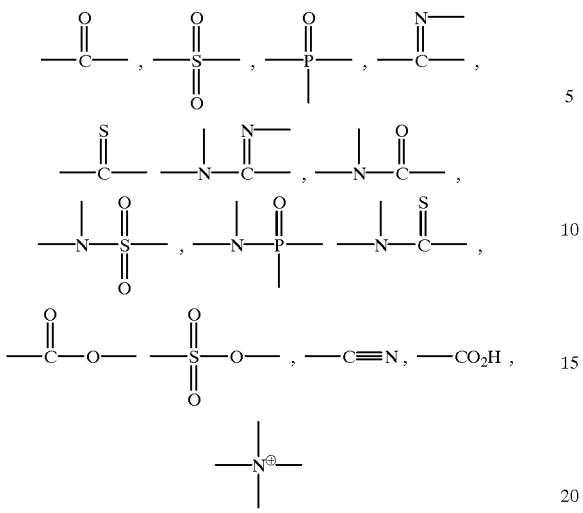

DETAILED DESCRIPTION OF THE PREFERRED EMBODIMENTS

Details of the present invention are given below.

[(A) a compound which acts as a cross-linking agent in the presence of an acid]

In the present invention, a phenol derivative represented by the general formula (I) or (II) is used as a compound which acts as a cross-linking agent in the presence of an acid (this compound is hereinafter referred to as "an acid-induced cross-linking agent" or simply as "a cross-linking agent" on occasion).

Firstly, the phenol derivative represented by the general formula (I) is explained below. In the general formula (I), $Ar^1$ represents an aromatic hydrocarbon ring which may bear a substituent group. Because of availability as a raw material, preferred examples of the aromatic hydrocarbon ring are a benzene ring, a naphthalene ring and an anthracene ring. Preferred examples of the substituent group include a halogen atom, a hydrocarbon group having 12 or less carbon atoms, an alkoxy group having 12 or less carbon atoms, an alkylthio group having 12 or less carbon atoms, a cyano group, a nitro group and a trifluoromethyl group. Because of the contribution to a high sensitivity, particularly preferred examples of $Ar^1$ are a benzene or naphthalene ring which bears no substituent group, and a benzene or naphthalene ring bearing a substituent group such as a halogen atom, a hydrocarbon group having 6 or less carbon atoms, an alkoxy group having 6 or less carbon atoms, an alkylthio group having 6 or less carbon atoms, a nitro group.

$R^1$ and $R^2$ may be the same or different and each represent a hydrogen atom or a hydrocarbon group having 12 or less carbon atoms. By reason of ease in the synthesis of the compound, it is particularly desirable that $R^1$ and $R^2$ be a hydrogen atom or a methyl group. $R^3$ represents a hydrogen atom or a hydrocarbon group having 12 or less carbon atoms. By reason of the contribution of the compound to a high sensitivity, it is particularly desirable that $R^3$ be a hydrocarbon group having 7 or less carbon atoms such as methyl, ethyl, propyl, cyclohexyl and benzyl. m is an integer of 2 to 4. n is an integer of 1 to 3.

Concrete examples of suitable phenol derivatives represented by the general formula (I) are given below as cross-linking agents [KZ-1] to [KZ-8], but it should be noted that the present invention is not limited to these compounds.

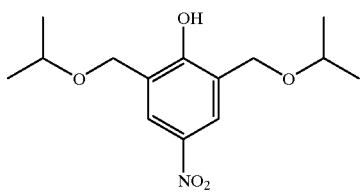

[KZ-8]

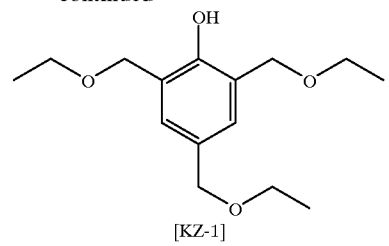

[KZ-1]

These phenol derivatives can be synthesized by a conventionally known method. For example, [KZ-1] can be synthesized according to a pathway indicated by the following reaction formula [1], wherein phenol, formaldehyde and a secondary amine such as dimethylamine or morpholine are reacted to form tri(dialkylaminomethyl)phenol, which is then reacted with acetic anhydride, and the resulting product is reacted with ethanol in the presence of a weak alkali such as potassium carbonate.

Reaction formula [1]

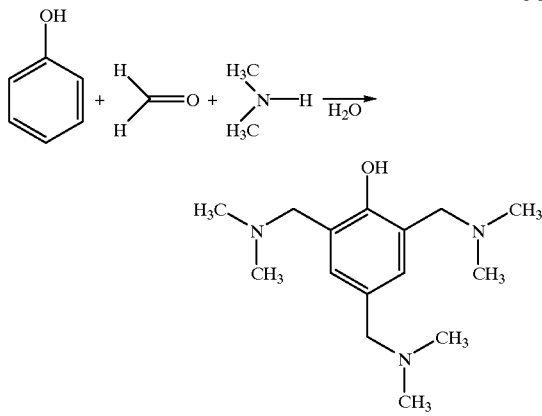

Another pathway is also possible. For example, [KZ-1] can be synthesized according to a pathway indicated by the following reaction formula [2], wherein phenol and formaldehyde or paraformaldehyde are reacted in the presence of an alkali such as KOH to form 2, 4, 6 - trihydroxymethylphenol, which is then reacted with ethanol in the presence of an acid such as sulfuric acid.

Reaction formula [2]

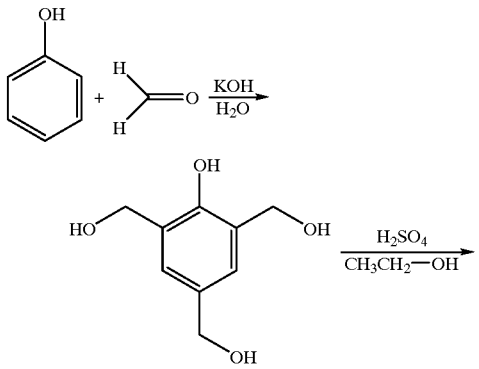

These phenol derivatives may be used singly or in a combination of two or more. In the synthesis of these phenol derivatives, the phenol derivatives may condense with each other to produce by-products such as a dimer and a trimer as impurities. Therefore, the phenol derivatives for use in the present invention may contain these impurities. If the phenol derivatives contain the impurities, the content of the impurities is preferably 30% or less and more preferably 20% or less.

The phenol derivative represented by the general formula (I) is combined with a polymer which constitutes a binder polymer and is a polymer having as a side chain an aromatic hydrocarbon ring having directly linked thereto a hydroxyl group or an alkoxy group. As a result, a negative working image recording material having a high sensitivity to a laser can be obtained.

Next, the phenol derivative represented by the general formula (II) is explained below. In the general formula (II) $Ar^1$ represents an aromatic hydrocarbon ring which may bear a substituent group. Because of availability as a raw material, preferred examples of the aromatic hydrocarbon ring are a benzene ring, a naphthalene ring and an anthracene ring. Preferred examples of the substituent group include a halogen atom, a hydrocarbon group having 12 or less carbon atoms, an alkoxy group having 12 or less carbon atoms, an alkylthio group having 12 or less carbon atoms, a cyano group, a nitro group and a trifluoromethyl group. Because of the contribution to a high sensitivity, particularly preferred examples of $Ar^1$ are a benzene or naphthalene ring which bears no substituent group, a halogen atom, a hydrocarbon group having 6 or less carbon atoms, an alkoxy group having 6 or less carbon atoms, an alkylthio group having 6 or less carbon atoms, and a benzene or naphthalene ring bearing a substituent group such as a nitro group.

$R^1$ and $R^2$ may be the same or different and each represents a hydrogen atom or a hydrocarbon group having 12 or less carbon atoms. By reason of ease in the synthesis of the compound, it is particularly desirable that $R^1$ and $R^2$ be a hydrogen atom or a methyl group. $R^3$ represents a hydrogen atom or a hydrocarbon group having 12 or less carbon atoms. By reason of the contribution of the compound to a high sensitivity, it is particularly desirable that $R^3$ be a hydrocarbon group having 7 or less carbon atoms such as methyl, ethyl, propyl, cyclohexyl and benzyl. m is an integer of 2 to 4. n is an integer of 1 to 3.

X represents a divalent linking group; Y represents a mono to quadravalent linking group or a hydrogen-terminated functional group each having a partial structure selected from the partial structures given previously and Z represents a mono to quadravalent linking group or a functional group which is present in accordance with the number of groups represented by Y with the proviso that Z is absent if Y is an terminal group.

Details of X in the general formula (II) are described below.

X is a divalent linking group and represents a single bond or a hydrocarbon-based linking group which may bear a substituent group. Preferred examples of the hydrocarbon-based linking group are straight-chain, branched or cyclic alkylene groups having 1 to 18 carbon atoms, straight-chain, branched or cyclic alkenylene groups having 2 to 18 carbon atoms, alkynylene groups having 2 to 8 carbon atoms, and arylene groups having 6 to 20 carbon atoms. More preferred examples of X are methylene, ethylene, propylene, butylene, isopropylene, cyclohexylene, phenylene, tolylene, biphenylene and the groups having the following structures.

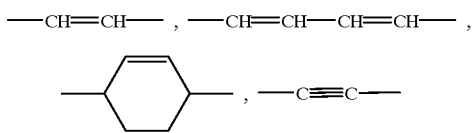

If these linking groups bear a substituent group, preferred examples of the substituent group include an alkoxy group having 12 or less carbon atoms, a halogen atom and a hydroxyl group.

Details of Y in the general formula (II) are described below.

Y is a functional group which may be a linking group having Z described later. As stated previously, Y may be monovalent, divalent, trivalent or quadravalent and is known to have a strong interaction with a phenolic hydroxyl group. Preferred examples of Y are functional groups having the partial structures illustrated below.

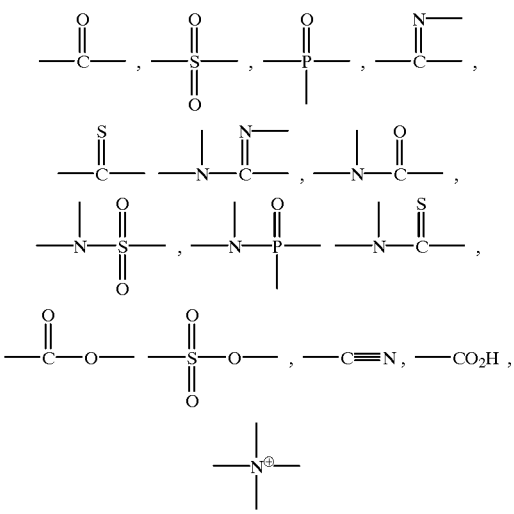

That the illustrated structure constitutes the partial structure of Y means that Y, which is a linking group or a hydrogen-ended terminal group, has at least one of the illustrated partial structures. Accordingly, Y includes, for example, a group comprising a plurality of the illustrated partial structures linked together and a group comprising any of the illustrated partial structures and an ordinary hydrocarbon group linked thereto.

More preferred examples of compounds having such a functional group include amides, sulfonamides, imides, ureas, urethanes, thioureas, carboxylic acids, carboxylates and sulfonates.

Details of Z in the general formula (II) are given below.

Z represents a mono to quadravalent linking group or a functional group which is present in accordance with the number of groups represented by Y with the proviso that Z is absent if the functional group Y is an terminal group.

Preferably, z is a hydrocarbon-based linking group or a group which may bear a substituent group. Preferred examples of the hydrocarbon-based linking group are straight-chain alkylene or alkyl groups having 1 to 18 carbon atoms, branched alkylene or alkyl groups having 1 to 18 carbon atoms, cyclic alkenylene or alkyl groups having 1 to 18 carbon atoms, arylene or aryl groups having 6 to 20 carbon atoms, straight-chain, branched or cyclic alkenylene or alkenyl groups having 2 to 18 carbon atoms, and alkynylene or alkynyl groups having 2 to 18 carbon atoms.

More preferred examples of Z which is monovalent include methyl, ethyl, propyl, isopropyl, butyl, isobutyl, tertiary butyl, secondarybutyl, pentyl, hexyl, cyclopentyl, cyclohexyl, octyl, benzyl, phenyl, naphthyl, anthracenyl, allyl and vinyl.

Preferred examples of Z as a linking group whose valency is two or more are the groups which result from the monovalent groups by eliminating therefrom hydrogen atoms in numbers corresponding to the valency.

If Z bears a substituent group, preferred examples of the substituent group include an alkoxy group having 12 or less carbon atoms, a halogen atom and a hydroxyl group.

Type A

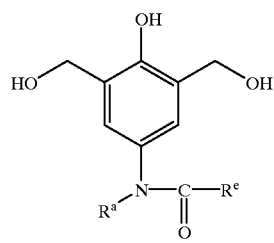

TABLE 1

| | $R^a$ | $R^e$ |
|---|---|---|
| (A-1) | H | H |
| (A-2) | H | $CH_3$ |
| (A-3) | H | $C_2H_5$ |
| (A-4) | H | $^iPr$ |
| (A-5) | H | $^tBu$ |
| (A-6) | H | Ph |
| (A-7) | $CH_3$ | $CH_3$ |
| (A-8) | $CH_3$ | $^iPr$ |
| (A-9) | $CH_3$ | Ph |
| (A-10) | Ph | $CH_3$ |
| (A-11) | Ph | $^iPr$ |

Type B

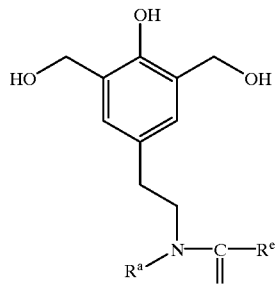

TABLE 2
|       | $R^a$ | $R^e$ |
|-------|-------|-------|
| (B-1) | H     | $C_2H_5$ |
| (B-2) | H     | $^iPr$ |
| (B-3) | H     | $^nBu$ |
| (B-4) | H     | $^tBu$ |
| (B-5) | H     | Ph    |
Type C
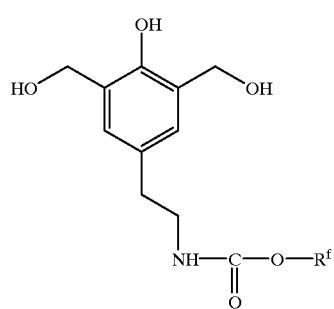
TABLE 3
|       | $R^f$ |
|-------|-------|
| (C-1) | $C_2H_5$ |
| (C-2) | $^iPr$ |
| (G-3) | $^nBu$ |
| (C-4) | Ph |
| (C-5) | —$CH_2$—Ph |
Type D
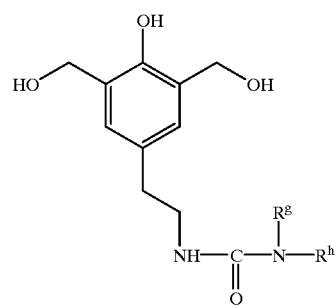
TABLE 4
|       | $R^g$ | $R^h$ |
|-------|-------|-------|
| (D-1) | H     | $^nBu$ |
| (D-2) | H     | cyclo-$C_6H_{11}$ |
| (D-3) | H     | Ph |
| (D-4) | H     | 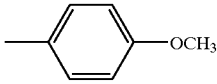 |
| (D-5) | H     | 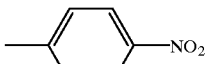 |
| (D-6) | $CH_3$ | $CH_3$ |
Type E
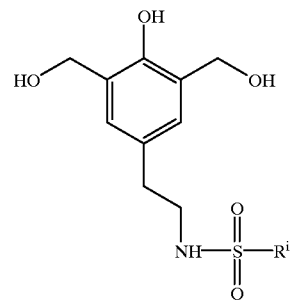
TABLE 5
|       | $R^i$ |
|-------|-------|
| (E-1) | $C_2H_5$ |
| (E-2) | Ph |
| (E-3) | 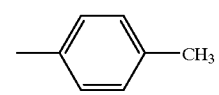 |
| (E-4) | 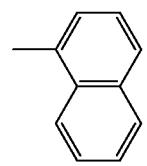 |
Type F
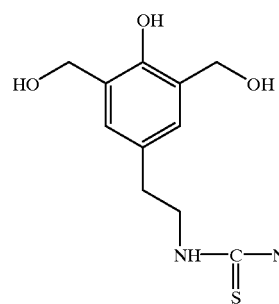
TABLE 6
|       | $R^j$ |
|-------|-------|
| (F-1) | $CH_2$—$CH$=$CH_2$ |
| (F-2) | $^nBu$ |
| (F-3) | Ph |

Type G
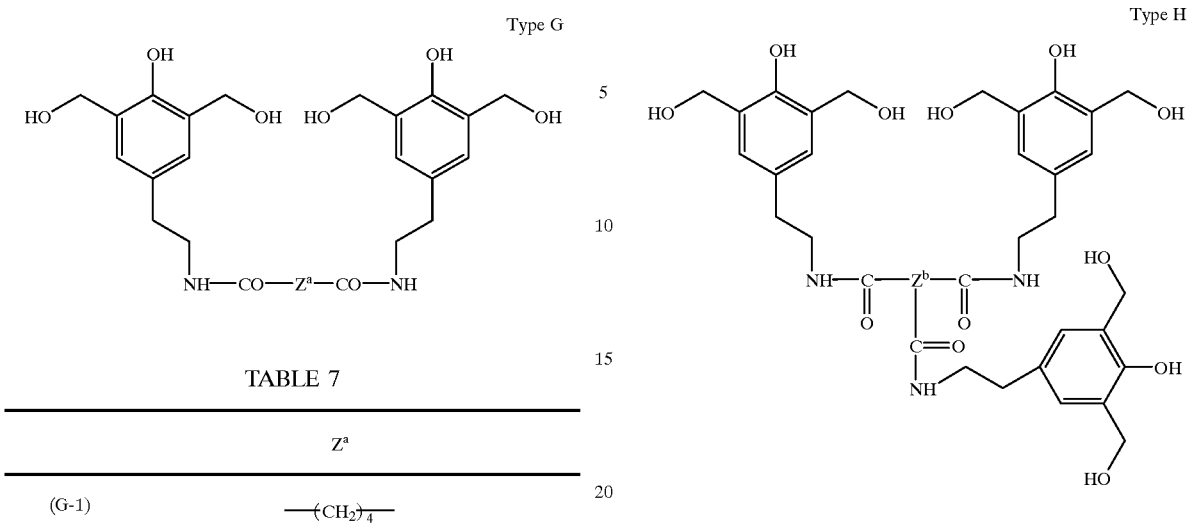
TABLE 7
| | $Z^a$ |
|---|---|
| (G-1) | —(CH₂)₄— |
| (G-2) | —C₆H₄—CH₂—C₆H₄— |
| (G-3) | —C₆H₄— |
| (G-4) | —NH—(CH₂)₆—NH— |
| (G-5) | 2-methyl-1,4-phenylenediamine linkage (—NH—C₆H₃(CH₃)—NH—) |
| (G-6) | —NH—CH₂—C₆H₄—CH₂—NH— (meta) |
| (G-7) | —O—(CH₂)₆—O— |
| (G-8) | —O—C₆H₄—O— |
Type H
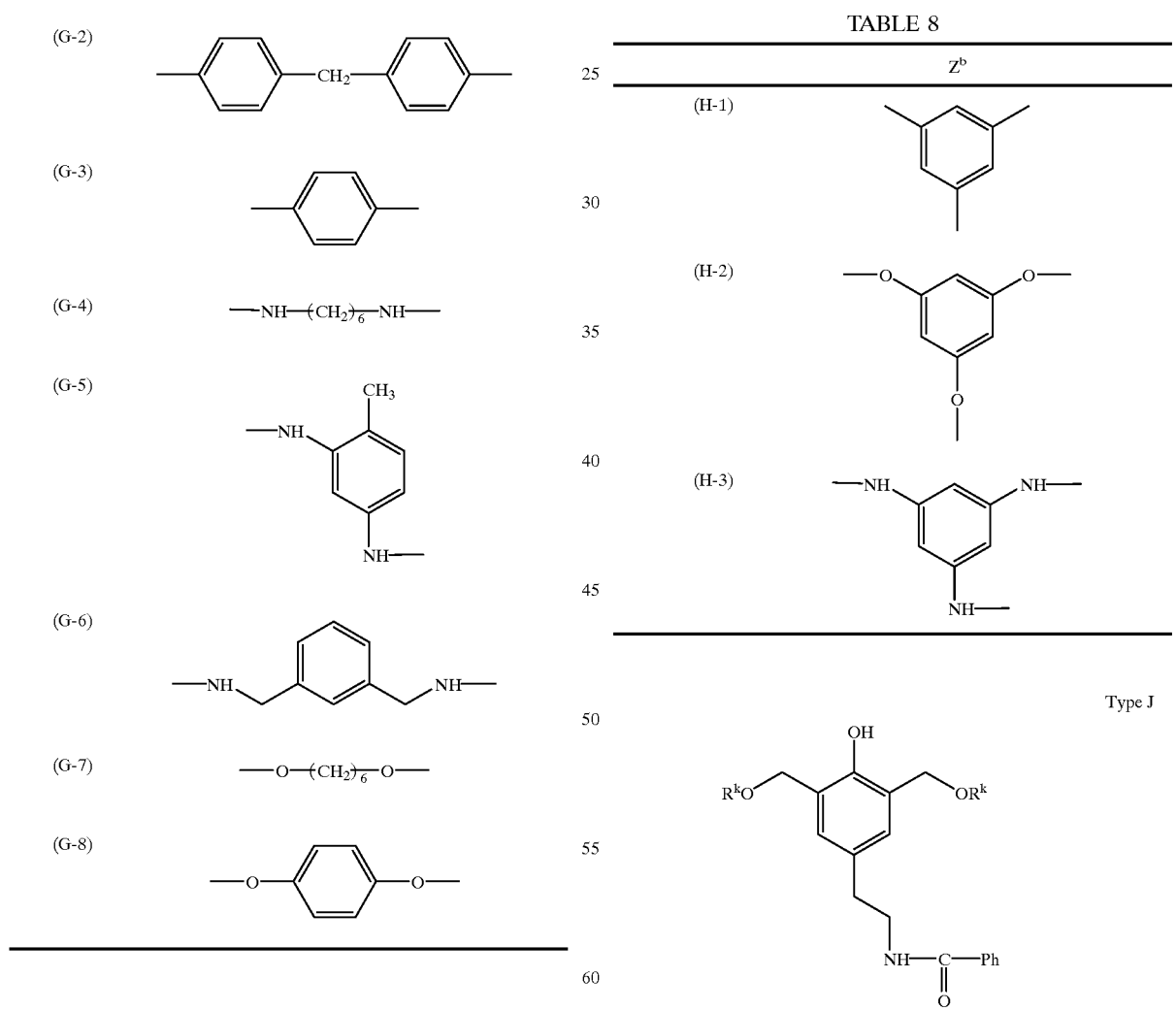
TABLE 8
| | $Z^b$ |
|---|---|
| (H-1) | 1,3,5-trisubstituted benzene (methyl positions) |
| (H-2) | 1,3,5-trimethoxy-substituted benzene linkage |
| (H-3) | 1,3,5-triaminobenzene linkage (—NH—C₆H₃(NH—)—NH—) |
Type J TABLE 9
| | $R^k$ |
|---|---|
| (J-1) | $CH_3$ |
| (J-2) | $C_2H_5$ |
| (J-3) | $^iPr$ |
| (J-4) | 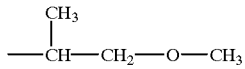 |
(S-1)
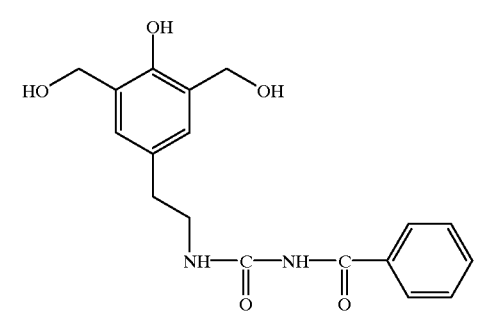
(S-2)
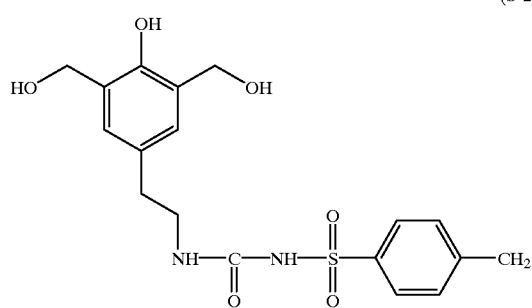
(S-3)
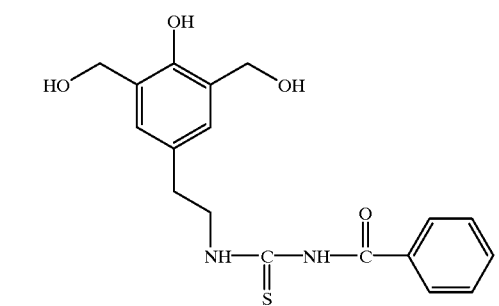
(S-4)
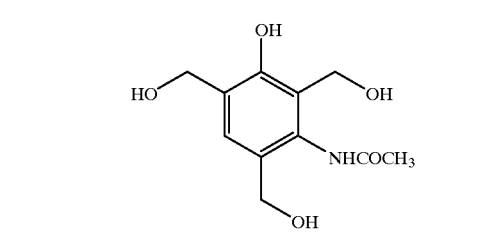
(S-5)
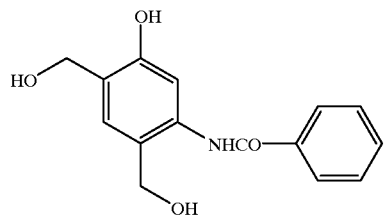
(S-6)
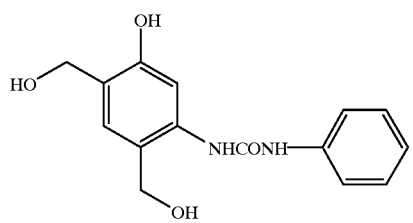
(S-7)
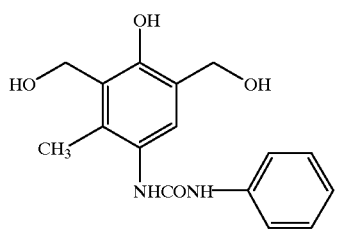
(S-8)
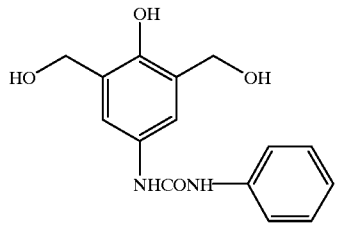
(S-9)
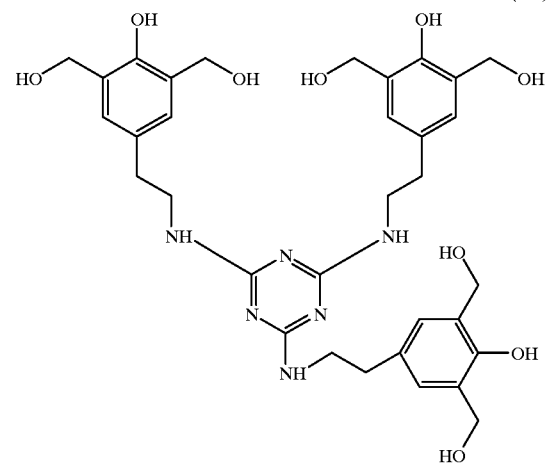

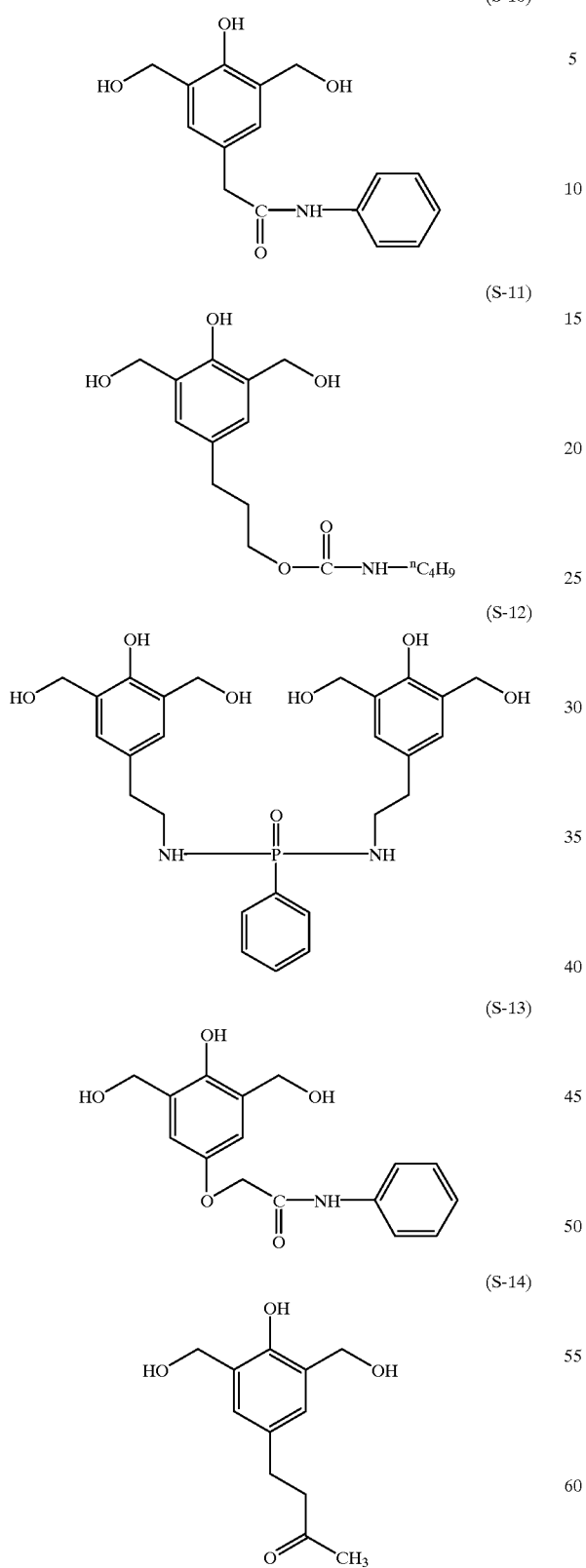
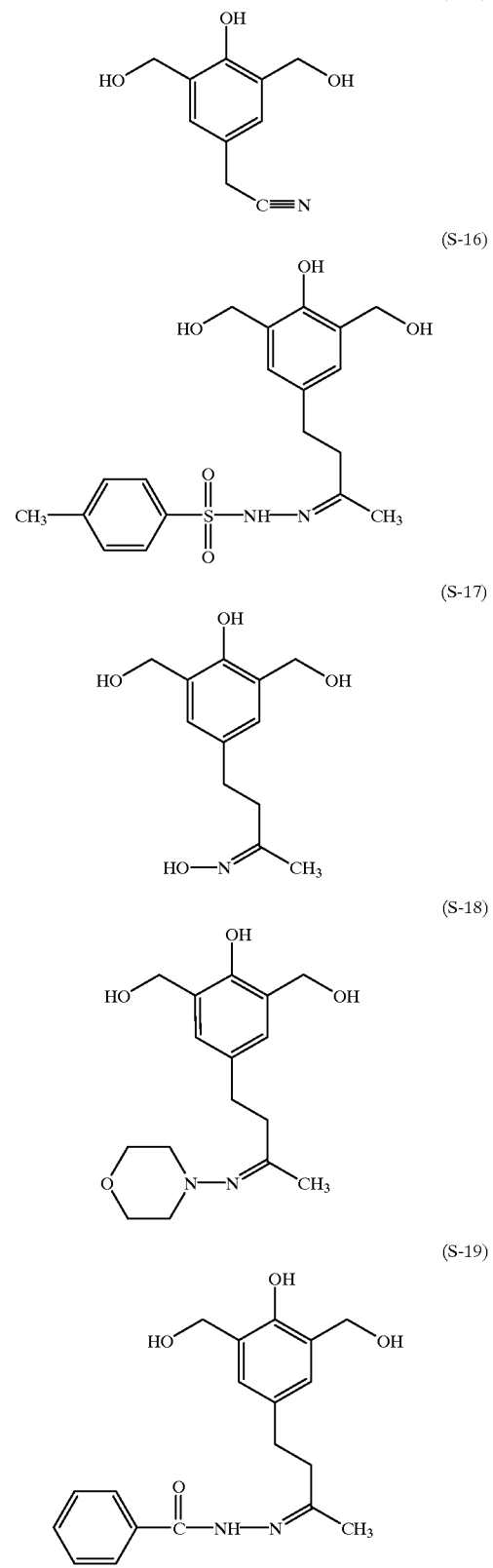

-continued
(S-20)
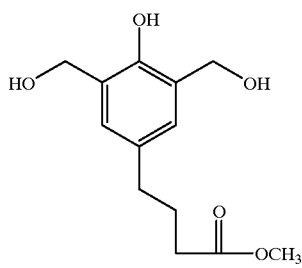
(S-21)
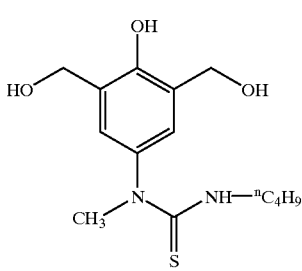
(S-22)
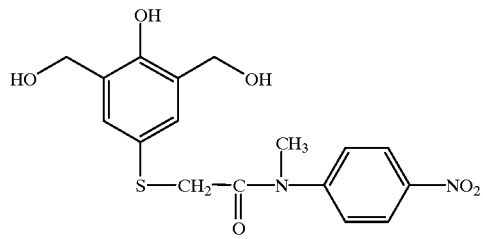
(S-23)
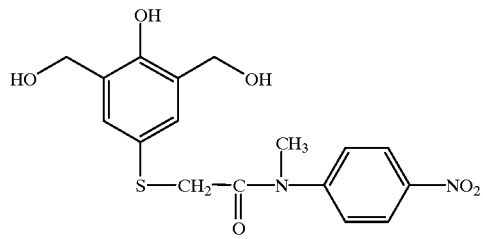
(S-24)
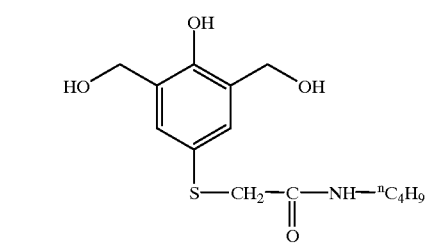
(S-25)
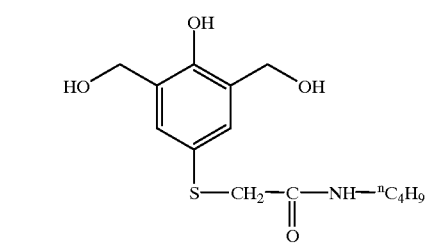
-continued
(S-26)
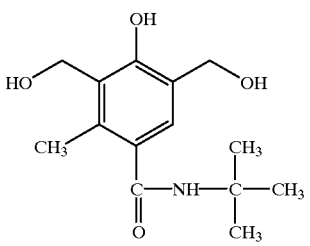
(S-27)
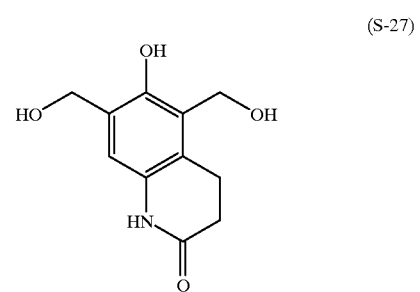
(S-28)
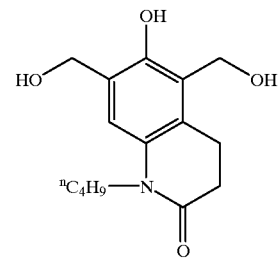
(S-29)
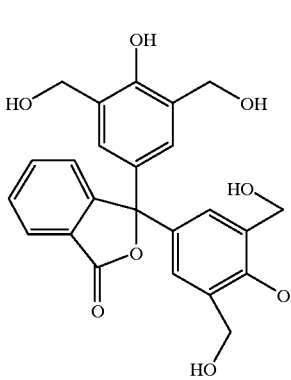
(S-30)
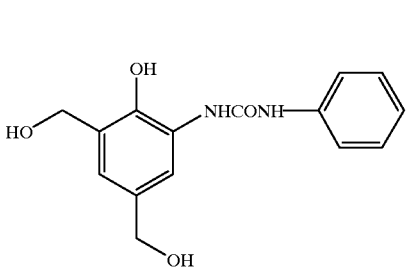

(S-31) 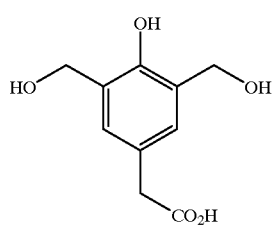
(S-32) 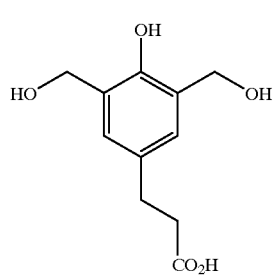
(S-33) 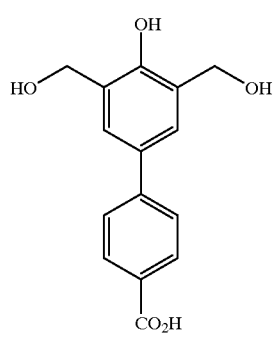
(S-34) 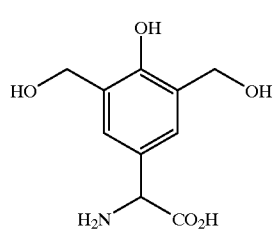
(S-35) 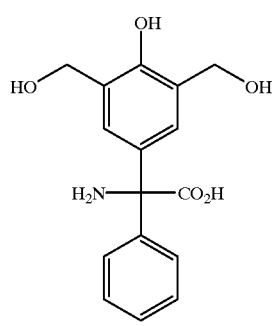
(S-36) 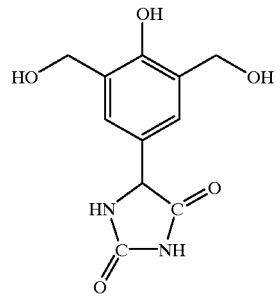
(S-37) 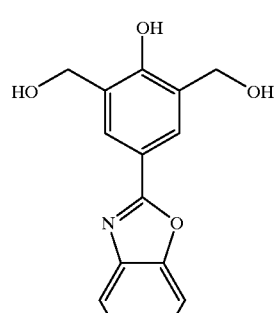
(S-38) 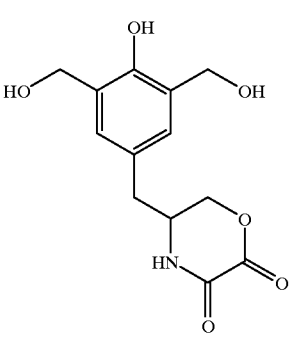
(S-39) 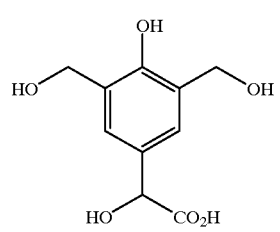
(S-40) 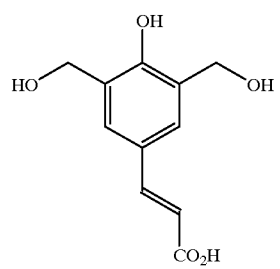

(S-41)
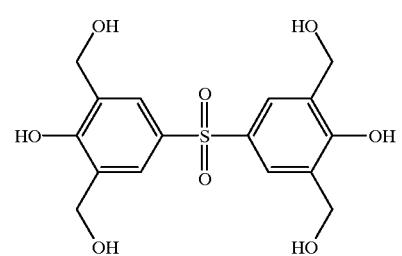
(S-42)
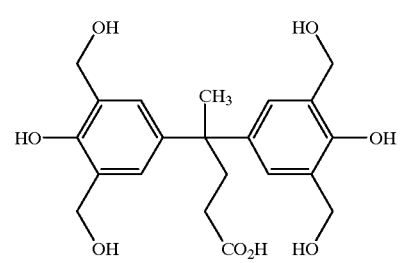
(S-43)
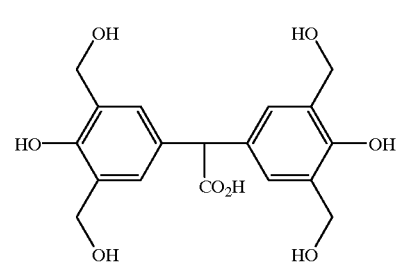
(S-44)
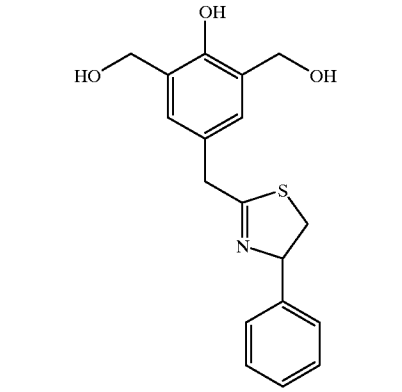
(S-45)
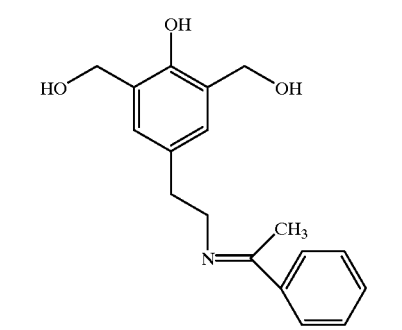
(S-46)
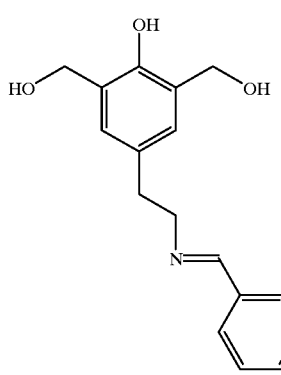
(S-47)
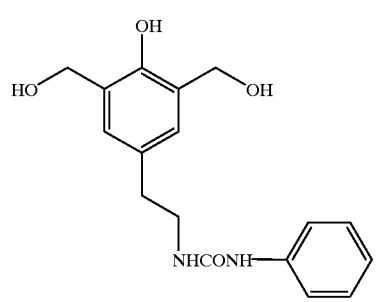
(S-48)
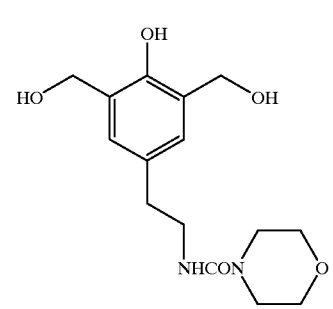
(S-49)
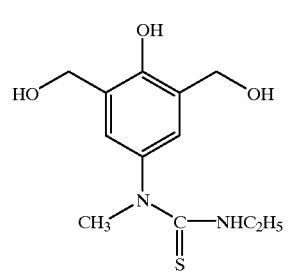
(S-50)
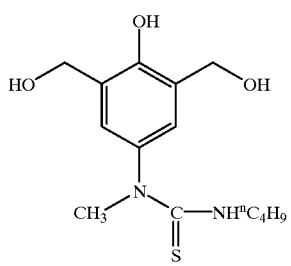

-continued
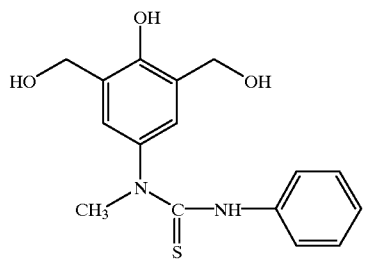
(S-51)
(S-52)
(S-53)
(S-54)
(S-55)
-continued
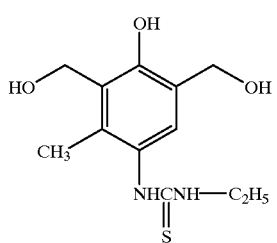
(S-56)
(S-57)
(S-58)
(S-59)
(S-60)

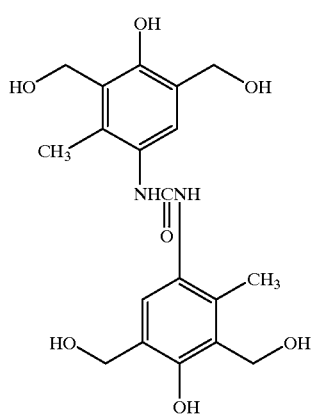
(S-61)
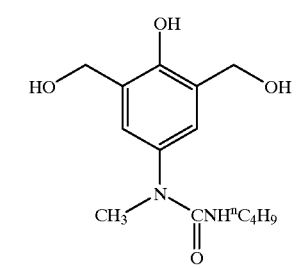
(S-62)
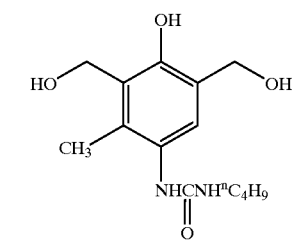
(S-63)
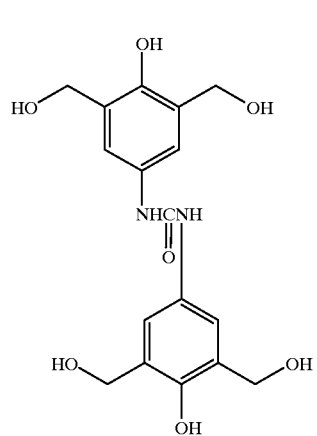
(S-64)
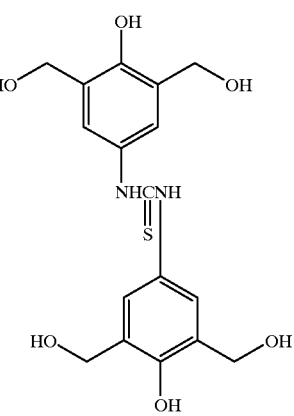
(S-65)
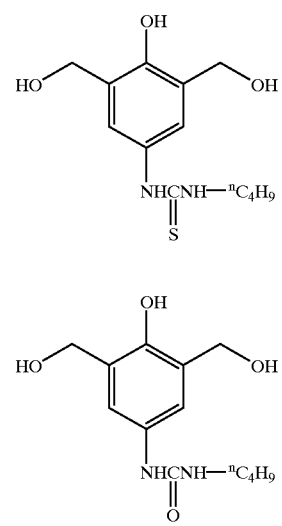
(S-66)
(S-67)
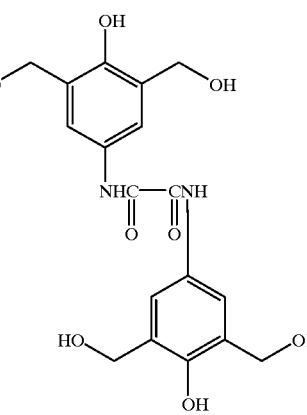
(S-68)

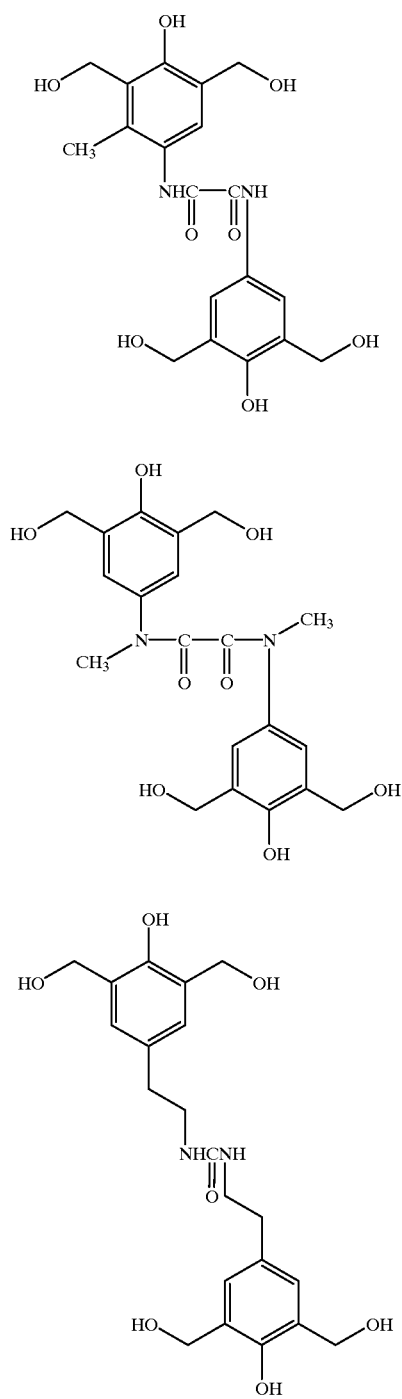
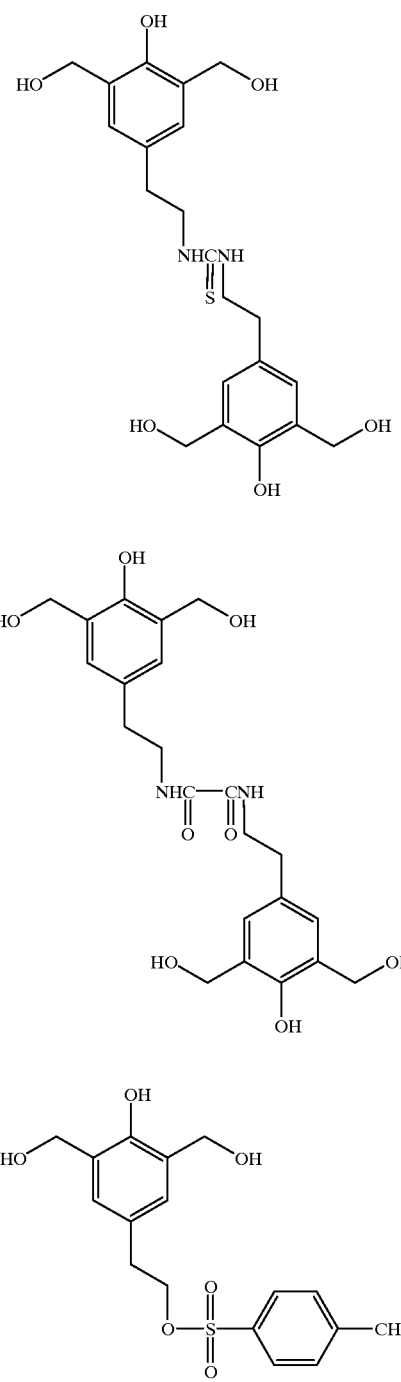

-continued (S-75)
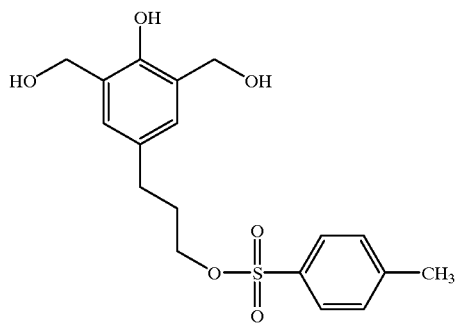

(S-76)
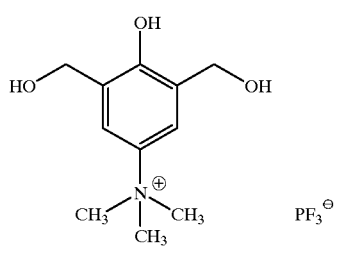

(S-77)
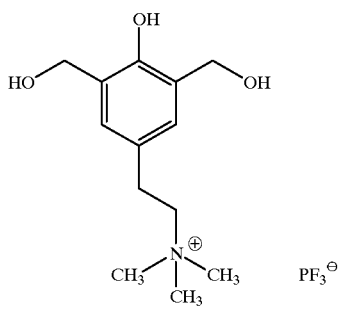

(S-78)
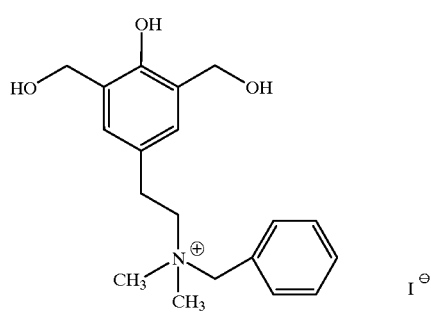

Among these compounds, the phenol derivatives which have an amide structure or a urea structure, each having a low molecular weight, have been unknown as a cross-linking agent, but these phenol derivatives are preferable from the standpoint of effectiveness.

The compound represented by the general formula (II) is preferably the compound represented by the following general formula (II-2).

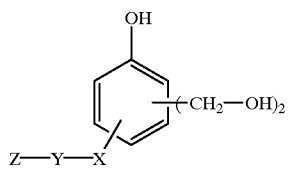

Where X, Y and Z represents same in the general formula (II).

More preferred examples of Y are NRCO, CONR (where R represents hydrogen atom or alkyl group having 1 to 12 carbon atoms), NHCONH, NHSO$_2$, SO$_2$NH.

These phenol derivatives which are useful as a cross-linking agent and represented by the general formula (II) can be synthesized by conventionally known methods. General methods for the synthesis are shown in the schemes I and II given below.

Scheme I

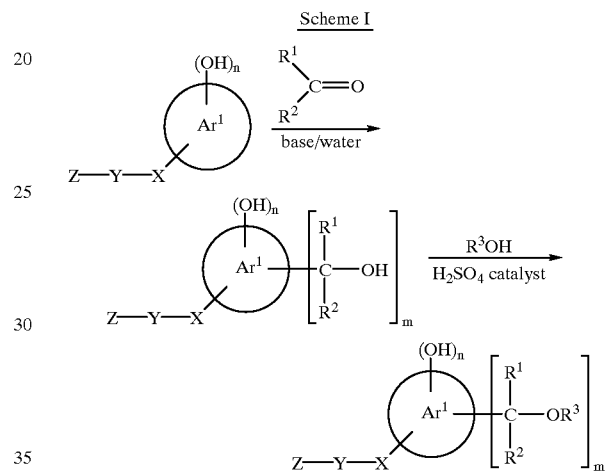

In the formula, a base means a strong alkali such as KOH, NaOH, Me$_4$N$^+$OH and the like.

Scheme II

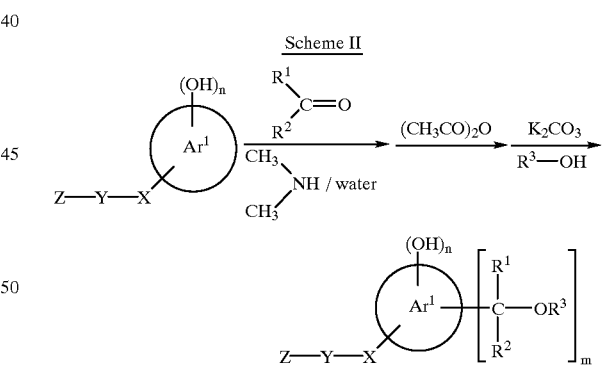

That is, a compound represented by the general formula (II) can be synthesized by the hydroxyalkylation and alkoxylation of a corresponding phenol derivative by means of a carbonyl compound.

These phenol derivatives may be used singly or in a combination of two or more. In the synthesis of these phenol derivatives, the phenol derivatives may condense with each other to produce by-products such as a dimer and a trimer as impurities. Therefore, the phenol derivatives for use in the present invention may contain these impurities. If the phenol derivatives contain the impurities, the content of the impurities is preferably 30% or less and more preferably 20% or less.

Further, the present inventors have found a method for producing a large quantity of high purity phenol derivatives more conveniently, and the method can also be suitably utilized. This method is a two-stage one as described below. After the hydroxyalkylation of the first process is effected in the above-described scheme I, an aqueous solvent such as acetone is immediately projected in-situ. The obtained product is once deposited in the form of alkali salt of phenol, and is further filtered to remove a by-product such as an oligomer, and thereafter, is subjected to neutralization with an acid.

In the present invention, the amount added of the phenol derivative is in the range of from 5 to 70% by weight, preferably in the range of from 10 to 50% by weight, based on the weight of the total solids of the image recording material. If the amount added of the phenol derivative as a cross-linking agent is less than 5% by weight, the film strength of the image areas of recorded image is poor, whereas, if the amount added is more than 70% by weight, the storability of the image recording material is poor.

[(B) Binder polymer]

Although the present invention uses a polymer having as a main chain or a side chain an aromatic hydrocarbon ring having directly linked thereto a hydroxyl group or an alkoxy group as a binder polymer, the present invention uses a polymer having as a side chain an aromatic hydrocarbon ring having directly linked thereto a hydroxyl group or an alkoxy group if a compound represented by the general formula (I) is used as a cross-linking agent.

Firstly, this polymer is explained below.

From the standpoint of contribution to a high sensitivity, the alkoxy group preferably has 20 or less carbon atoms. Because of availability as a raw material, preferred examples of the aromatic hydrocarbon ring are a benzene ring, a naphthalene ring and an anthracene ring. These aromatic hydrocarbon rings may bear in addition to the hydroxyl group and the alkoxy group other substituent groups such as a halogen atom and a cyano group. However, in order not to adversely affect the sensitivity, the substituent is preferably limited to the hydroxyl group or the alkoxy group.

A polymer suitable for use in the present invention is a polymer having the structural units represented by the following general formula (III).

General formula (III)

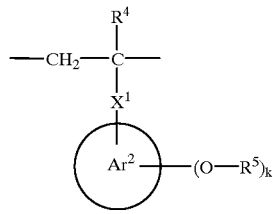

In the general formula (III), $Ar^2$ represents a benzene ring, a naphthalene ring or an anthracene ring; $R^4$ represents a hydrogen atom or a methyl group; $R^5$ represents a hydrogen atom or an alkoxy group having 20 or less carbon atoms; $X^1$ represent a single bond or a divalent linking group having at least one atom selected from the group consisting of C, H, N, O and S together with 0 to 20 carbon atoms; and k is an integer of 1 to 4.

Examples ([BP-1] to [BP-6]) of the structural units represented by the general formula (III) suitable for use in the present invention are given below, but it should be noted that the present invention is not limited to these structural units.

[BP-1]

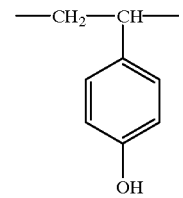

[BP-2]

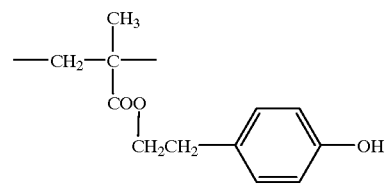

[BP-3]

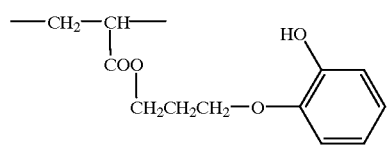

[BP-4]

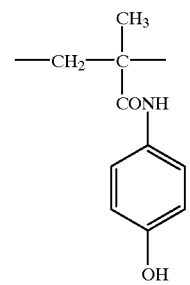

[BP-5]

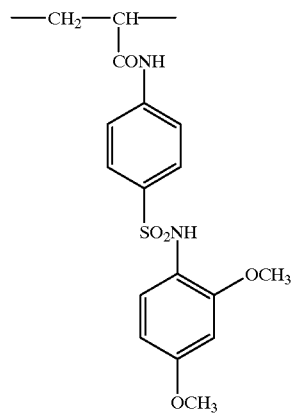

[BP-6]

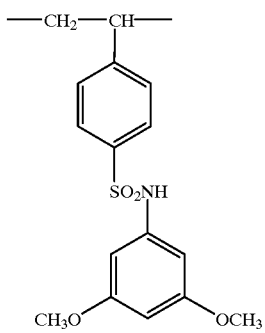

Polymers having these structural units can be obtained by a radical polymerization of corresponding monomers according to a conventionally known method.

A desirable binder polymer for use in the present invention may be a homopolymer composed only of the structural units represented by the general formula (III), or may be a copolymer composed of the structural units represented by the general formula (III) together with the structural units derived from other known monomer. Examples of the other known monomers include acrylates, such as methyl acrylate, ethyl acrylate, propyl acrylate, butyl acrylate, 2-ethylhexyl acrylate, cyclohexyl acrylate, 2-hydroxyethyl acrylate and benzyl acrylate; methacrylates, such as methyl methacrylate, ethyl methacrylate, propyl methacrylate, butyl methacrylate, 2-ethylhexyl methacrylate, cyclohexyl methacrylate, 2-hydroxyethyl methacrylate and benzyl methacrylate; styrene, acrylonitrile, monomers having an acidic group, such as acrylic acid and methacrylic acid; and monomers which contain a salt of a strong acid and are exemplified by a sodium salt of p-styrenesulfonic acid, an alkali metal salt of 2-acrylamide-2-methylpropanesufonic acid, a tetraalkylammonium salt of 2-acrylamide-2-methylpropanesufonic acid and a potassium salt of 3-sulfopropyl acrylate.

The content of the structural unit represented by the general formula (III) in a copolymer prepared by using any of these monomers is preferably in the range of from 50 to 100% by weight and more preferably in the range of from 60 to 100% by weight.

In the present invention, the weight average molecular weight of the polymer is preferably 5,000 or more and more preferably in the range of from 10,000 to 300,000. The number average molecular weight is preferably 1,000 or more and more preferably in the range of from 2,000 to 250,000. The index of polydispersity (weight average molecular weight/number average molecular weight) is preferably 1 or more and more preferably in the range of from 1.1 to 10.

These polymers may be a random polymer, a block polymer or a graft polymer. However, a random polymer is preferable.

Examples of the solvent which is used for the synthesis of the polymer for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents may be used singly or in a combination of two or more.

An initiator for the radical polymerization to synthesize the polymer for use in the present invention may be a known initiator such as an azo compound or a peroxide.

In the present invention, if a compound represented by the general formula (II) is used as a cross-linking agent, the aforesaid polymer, which has in the main chain an aromatic hydrocarbon ring having directly linked thereto a hydroxyl group or an alkoxy group, can also be used in addition to a polymer which has in the side chain an aromatic hydrocarbon ring having directly linked thereto a hydroxyl group or an alkoxy group and which is exemplified by the polymer represented by the general formula (III). Exemplary of the polymer, which has in the main chain an aromatic hydrocarbon ring having directly linked thereto a hydroxyl group or an alkoxy group, are novolac resins.

Novolac resins are described below. Examples of the novolac resins suitable for use in the present invention include phenol novolacs, cresol novolacs such as o-cresol novolacs, m-cresol novolacs and p-cresol novolacs, copolymers of the foregoing, and novolacs prepared from a substituted phenol such as a halogen-substituted phenol or an alkyl-substituted phenol.

In the present invention, the weight average molecular weight of the novolac resin is preferably 1,000 or more and more preferably in the range of from 2,000 to 20,000. The number average molecular weight is preferably 1,000 or more and more preferably in the range of from 2,000 to 15,000. The index of polydispersity (weight average molecular weight/number average molecular weight) is preferably 1 or more and more preferably in the range of from 1.1 to 10.

The binder polymers for use in the present invention may be used singly or in a combination of two or more. The amount added of the binder polymer in the image recording material of the present invention is in the range of from 20 to 95% by weight, more preferably in the range of from 40 to 90% by weight, based on the weight of the total solids of the image recording material. If the amount added is less than 20% by weight, the strength of image areas of the images formed is poor, whereas, if the amount added is more than 95% by weight, the image formation is impossible.

A combination of (A) a phenol derivative represented by the general formula (I) and (B) a binder polymer which has as a side chain an aromatic hydrocarbon ring having directly linked thereto a hydroxyl group or the like leads to a high sensitivity when exposed to a laser. Although no perfectly clear mechanism is established to explain this phenomenon, the high sensitivity is understood to be achieved by a higher cross-linking level which results from the interaction between (A) the phenol derivative represented by the general formula (I) and (B) the binder polymer having the above-mentioned structure, because the aromatic hydrocarbon ring is present as a side chain of the binder polymer.

This high sensitivity cannot be achieved by a combination of (A) a phenol derivative represented by the general formula (I) and a novolac resin as a (B) binder polymer which has an aromatic hydrocarbon ring having directly linked thereto a hydroxyl group or the like as a main chain but not as a side chain.

Meanwhile, if the specific phenol derivative, which is described in JP-A No. 8-276,558 and has 4 to 8 benzene rings in the molecule, is used as (A) a phenol derivative, a higher sensitivity is expected to results from a presumably higher cross-linking efficiency which is generally believed to be brought about by a larger molecular weight of the cross-linking agent. However, as a matter of fact, a high sensitivity cannot be achieved by the use of the specific phenol derivative having 4 to 8 benzene rings in the molecule. Accordingly, the effectiveness of the phenol derivative represented by the general formula (I) for use in the present invention is believed to lie in the low molecular weight which facilitates the interaction with the specific aromatic hydrocarbon ring present in the side chain of (B) a binder polymer having a specific structure.

Besides (B) the above-mentioned binder polymer having a specific structure, a novolac resin, which has an aromatic hydrocarbon ring having directly linked thereto a hydroxyl group or the like as a main chain and therefore cannot bring about a high sensitivity in a combination with the phenol resin represented by the general formula (I), also leads to a high sensitivity to laser exposure and an improved storability in a highly humid environment when used in combination with (A) a phenol derivative represented by the general formula (II).

For the purpose of reasoning this fact, the present inventors conducted experiments and compared the results. As a result, they have found that the presence of a specific functional group, i.e., Y in the general formula (II), in the cross-linking agent, leads to a good sensitivity and storability. Based on the effect of this specific functional group, they conclude the mechanism, not perfectly established though, as follows: the sensitivity and the storability are both improved without conflict between these two characteristics if the interaction (i.e., hydrogen bond, acceptor/donor interaction or acid/base interaction) between the specific functional group and a phenolic —OH group is of a high level such that the enthalpy (—ΔH) of interaction between a model compound having the specific functional group and phenol satisfies the inequality given below as described in Joesten Schaad, Hydrogen bonding , pp.291–381.

$$-\Delta H > 3.0 \text{ kcal/mol}$$

Based on the reasoning stated above, it is presumed that the effect of the present invention is obtained by the use of a cross-linking agent having a functional group (linking group) Y, because the strong interaction of Y with the phenolic —OH of the binder polymer renders the resulting film more resistant to external factors (i.e., water and heat) and because the cross-linking agent is held in the vicinity of the phenol so that the cross-linking efficiency is increased. The same situation is also conceivable in the case of a binder having an alkoxy group. Further, the use of the cross-linking agent represented by the general formula (II) remarkably inhibits the cross-linking agent from bleeding, which is caused by the crystallization of the excess cross-linking agent on the surface after the separation of the excess cross-linking agent from the binder polymer, in contrast with the case where a conventional cross-linking agent which does not have the specific functional group Y is used.

The reasoning stated above is also supported by the fact that the use of the cross-linking agent represented by the general formula (II) leads to a satisfactory sensitivity both in the case where the binder polymer has phenolic OH groups in the side chain as in polyhydroxystyrene and in the case where the binder polymer has phenolic OH groups in the main chain as innovolacs and further by the fact that even a polyfunctional cross-linking agent having a fairly large molecular weight can also bring about a satisfactory sensitivity.

[(C) Compounds which generate an acid by the action of heat]

In the present invention a compound which generates an acid by the action of heat (hereinafter referred to as "an acid generating agent" on occasion) means a compounds which decomposes at or above 100° C. to generates an acid. The acid thus generated is preferably a strong acid such as sulfonic acid or hydrochloric acid having a pKa value of 2 or less.

Examples of the acid generating agents suitable for use in the present invention include onium salts such iodonium salts, sulfonium salts, phosphonium salts and diazonium salts. Concrete examples of these salts are the compounds described in, e.g., U.S. Pat. No. 4,708,925 and JP-A No. 7-20,629. Iodonium salts having sulfonate ion as a counter ion, sulfonium salts and diazonium salts are particularly preferable. Preferred diazonium salts are the diazonium compounds described in U.S. Pat. No. 3,867,147, diazonium compounds described in U.S. Pat. No. 2,632,703 and diazo resins described in JP-A Nos. 1-102,456 and 1-102,457. Other desirable compounds are benzyl sulfonates described in U.S. Pat. Nos. 5,135,838 and 5,200,544; active sulfonates and disulfonyl compounds described in JP-A Nos. 2-100, 054 and 2-100,055 and Japanese Patent Application No. 8-9,444; and S-triazines substituted with haloalkyl described in JP-A No. 7-271,029.

The amount added of the acid generating agent in the image recording material is in the range of from 0.01 to 50% by weight, preferably in the range of from 0.1 to 40% by weight, and more preferably in the range of from 0.5 to 30% by weight, based on the weight of the total solids of the image recording material. If the amount added is less than0.01% by weight, image formation is impossible, whereas, if the amount added is more than 50% by weight, smudging is generated in non-image areas in printing operation.

These compounds may be used singly or in a combination of two or more. Since these acid generating agents can also be decomposed by the irradiation of ultraviolet rays, the image recording material of the present invention can be used for image formation not only by infrared rays but also by ultraviolet rays.

[(D) Infrared absorber]

The main objective of the present invention is to provide a recording material capable of recording an image by means of a laser emitting infrared rays. Because of this, it is necessary to incorporate an infrared absorber in the recording material. That is, the function of the infrared absorber is to convert the absorbed infrared rays into heat, which decomposes (C) an acid generating agent so that and acid is generated. The infrared absorber for use in the present invention is a dye or a pigment each capable of effectively absorbing infrared rays having wavelengths in the range of from 760 nm to 1200 nm. Preferably, the infrared absorber is a dye or a pigment each having a peak of absorption in the wavelength range of from 760 nm to 1200 nm.

The dyes suitable for use in the present are commercially available dyes and those described in, for example, "Handbook of Dyes" edited by Association of Organic Synthesis (Yuki Gosei Kagaku Kyokai) (1970). Examples of the dyes include azo dyes, azo dyes in the form of a complex salt of metal, pyrazolone azo dyes, naphthoquinone dyes, anthraquinone dyes, phthalocyanine dyes, carbonium dyes, quinonimine dyes, methine dyes, cyanine dyes, squalylium dyes, pyrylium dyes and dyes in the form of metal thiolate complex.

Preferred examples of the dyes include cyanine dyes described in, e.g., JP-A Nos. 58-125,246; 59-84,356; 59-202,829 and 60-78,787, methine dyes described in, e.g., JP-A Nos. 58-173,696; 58-181,690 and 58-194,595, naphthoquinone dyes described in, e.g., JP-A Nos. 58-112,793;

58-224,793; 59-48,187; 59-73,996; 60-52,940 and 60-63,744, squalyliumdyes described in JP-A No. 58-112,792 and cyanine dyes described in British Patent No. 434,875.

Other suitable compounds are a near-infrared absorbing sensitizer described in U.S. Pat. No. 5,156,938, a substituted arylbenzo(thio)pyrylium salt described in U.S. Pat. No. 3,881,924, a trimethinethiapyrylium salt described in JP-A No. 57-142,645 (U.S. Pat. No. 4,327,169), pyrylium compounds described in JP-A Nos. 58-181,051; 58-220,143; 59-41,363; 59-84,248; 59-84,249; 59-146,063 and 59-146,061, a cyanine dye described in JP-A No. 59-216,146 a pentamethinethiopyrylium salt described in U.S. Pat. No. 4,283,475 and pyrylium compounds described in Japanese Patent Application Publication (JP-B) Nos. 5-13,514 and 5-19,702.

Additional preferred examples of the dyes are near-infrared absorbing dyes represented by the formulas (I) and (II) in U.S. Pat. No. 4,756,993.

Among these dyes, cyanine dyes, squalylium dyes, pyrylium dyes and nickel thiolate complexes are particularly preferable.

The pigments suitable for use in the present are commercially available pigments and those described in, for example, "Handbook of Color Index (C. I.)", "Latest Pigment Handbook" (Saishin Ganryo Binran) edited by Japan Association of Pigment Technologies (Nihon Ganryo Gijutsu Kyokai) (1977), "Latest Pigment Application Technologies" (Saishin Ganryo Oyo Gijutsu), CMC, 1986 and "Printing Ink Technologies" (Insatsu Inki Gijutsu), CMC, 1984.

Examples of the pigments include black pigments, yellow pigments, orange pigments, brown pigments, red pigments, purple pigments, blue pigments, green pigments, fluorescent pigments, metal powder pigments and polymers containing chemically combined dyes. Concrete examples of the pigments are insoluble azo pigments, azo lake pigments, condensed azo pigments, chelated azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments and carbon black. Among these pigments, carbon black is preferable.

These pigments may be used without being surface-treated or may be used after surface treatment thereof. Possible surface treatments include a treatment wherein a resin or a wax is coated on the surface of the pigments, a treatment wherein a surfactant is adhered to the surface of the pigments, and a treatment wherein a reactive substance (e.g., a silane coupling agent, an epoxy compound and a polyisocyanate) is bound to the surface of the pigments. These surface-treating methods are described in "Properties and Applications of Metal Soaps" (Saiwai Shobo Co., Ltd.), "Printing Ink Technologies" (Insatsu Inki Gijutsu) , CMC, 1984 and "Latest Pigment Application Technologies" (Saishin Ganryo Oyo Gijutsu) , CMC, 1986.

The diameter of the pigments is preferably 0.01 to 10 $\mu$m, more preferably 0.05 to 1 $\mu$m, and most preferably 0.1 to 1 $\mu$m. If the diameter is less than 0.01 $\mu$m, the dispersion stability of the pigments in a coating liquid to form an image recording layer is insufficient, whereas, if the diameter is greater than 10 $\mu$m, the uniformity of the image recording layer after coating thereof is poor.

A known dispersing technology by use of a dispersing machine for use in the preparation of ink and toners can also be used for the purpose of dispersing the pigments. Examples of the dispersing machine include a dispersing machine by means of ultrasonic waves, a sand mill, an attritor, a pearl mill, a super mill, a ball mill, an impeller, a disperser, a KD mill, a colloid mill, a dynatron, a three-roller mill and a pressurized kneader. Details of these dispersing technologies are described in "Latest Pigment Application Technologies" (Saishin Ganryo Oyo Gijutsu), CMC, 1986.

The amounts added of the dye or the pigment in the image recording material are each in the range of from 0.01 to 50% by weight and more preferably in the range of from 0.1 to 10% by weight, based on the weight of the total solids of the image recording material. Most preferably, the amount added of the dye is in the range of from 0.5 to 10% by weight, while the amount added of the pigment is in the range of from 1.0 to 10% by weight. If the amount added of the pigment or the dye is less than 0.01% by weight, the sensitivity of the image recording material may decrease, whereas, if the amount added is more than 50% by weight, non-image areas of the printed material tend to be smudgy in printing operation.

The dye or the pigment may be added to the same layer together with other component, or otherwise the dye or the pigment may be added to a different layer.

[Other components]

In order to impart desirable characteristics to the negative working image recording material of the present invention, components other than those described above may be added to the image recording material in so far as the other components added do not adversely affect the effect of the present invention.

For example, a dye, which has large absorbance in a visible light range, may be used as a colorant of image. Concrete examples include Oil Yellow No. 101, Oil Yellow No. 103, Oil Pink No. 312, Oil Green BG, Oil Blue BOS, Oil Blue No. 603, Oil Black BY, Oil Black BS and Oil Black T-505 (these are manufactured by orient Chemical Industries, Co., Ltd.), Victoria Pure Blue, Crystal Violet(C. I. 42555), Methyl Violet(C. I. 42535), Ethyl Violet(C. I. 145170B), Rhodamine B(C. I. 145170B), Malachite Green (C. I. 42000), Methylene Blue(C. I. 52015) and AIZEN SPILON BLUE C-RH (these are manufactured by Hodogaya Chemical Co., Ltd.) along with dyes described in JP-A No. 62-293,247.

It is desirable to add this type of dye to the image recording material, because this type of dye is effective in distinguishing image areas from non-image areas after the image formation. The amount added of the dye is in the range of from 0.01 to 10% by weight based on the weight of the total solids of the image recording material.

Further, in order to broaden the latitude of stability to processing conditions, the image recording material may contain a nonionic surfactant as described in JP-A Nos. 62-251,740 and 3-208,514 and an amphoteric surfactant as described in JP-A Nos. 59-121,044 and 4-13,149.

Examples of the nonionic surfactant include sorbitan tristearate, sorbitan monopalmitate, sorbitan trioleate, stearyl monoglyceride and polyoxyethylene nonylphenyl ether.

Examples of the amphoteric surfactant include alkyldi(aminoethyl)glycine, hydrochloric acid salt of alkylpolyaminoethylglycine, 2-alkyl-N-carboxyethyl-N-hydroxyethylimidazolinium betaine and N-tetradecyl-N,N-betaine (e.g., Amogen K manufactured by Dai-ichi Kogyo Seiyaku Co., Ltd.).

The preferred amounts added of the nonionic surfactant and the amphoteric surfactant are each in the range of from 0.05 to 15% by weight, more preferably from 0.1 to 5% by weight, based on the weight of the total solids of the image recording material.

In order to impart flexibility to the image recording layer, a plasticizer is incorporated into the image recording material. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The image recording layer is usually formed by coating a coating liquid, which is prepared by dissolving the above-described components in a solvent, on an appropriate substrate. Some illustrative nonlimiting examples of the solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butylolactone, toluene and water. These solvents may be used singly or in a combination of two or more. The concentration of the total components (total solids including additives) in the coating liquid is preferably in the range of from 1 to 50% by weight. The coated amount (solids) after drying on the substrate varies according to the applications, but the desirable amount is generally in the range of from 0.5 g to 5.0 g/m$^2$ in the case of a material for a lithographic printing plate. The coating liquid can be applied by various methods. Examples of the methods include bar coating, rotational coating, spraying, curtain coating, dipping, air-knife coating, blade coating and roll coating. As the coated amount decreases, the characteristics of the coated layer becomes poor, although apparent sensitivity increases.

In order to improve the coatability, the image recording material may contain a surfactant. An example of this surfactant is a fluorine-containing surfactant described in JP-A No. 62-170,950. The preferred amount added of the surfactant is in the range of from 0.01 to 1% by weight, more preferably from 0.05 to 0.5% by weight, based on the weight of the total solids of the image recording material.

[Substrate]

After being coated on a substrate, the image recording material of the present invention can be used as a material for a lithographic printing plate, a color proof, a photoresist or a color filter. A substrate on which the image recording material of the present invention is coated is a dimensionally stable plate. Examples of the substrate include paper, paper laminated with a plastic (e.g., polyethylene, polypropylene and polystyrene), plates of metals (such as aluminum, zinc and copper), plastic films (such as diacetylcellulose, triacetylcellulose, cellulosepropionate, cellulosebutyrate, cellulose butyrate acetate, cellulose nitrate, polyethylene terephthalate, polyethylene, polystyrene, polypropylene, polycarbonate and polyvinyl acetal), and paper or plastic films laminated or vapor-deposited with the foregoing metals.

Among these materials, a polyester film and an aluminum plate are preferable. An aluminum plate is particularly preferable, because it has a good dimension stability and is relatively cheap. The examples of the aluminum plate include a pure aluminum plate and a plate of an aluminum alloy which is an alloy of aluminum with a trace of other elements. A further example of the substrate is a plastic film which is laminated with aluminum or vapor-deposited with aluminum. Examples of the other elements which may be contained in the aluminum alloy include silicon, iron, manganese, copper, magnesium, chromium, zinc, bismuth, nickel and titanium. The total content of the other elements in the aluminum alloy is 10% by weight or less. Although the aluminum particularly desirable for use in the present invention is pure aluminum, the aluminum to be used in the present invention may contain a small amount of other elements, because limitations in purification technologies make the production of perfectly pure aluminum difficult. Accordingly, the composition of the aluminum plate for use in the present invention is not particularly limited, and a conventionally known aluminum plate may be used appropriately in the present invention. The thickness of the aluminum plate for use in the present invention is about 0.1 to 0.6 mm, preferably 0.15 to 0.4 mm, and most preferably 0.2 to 0.3 mm.

The aluminum plate is preferably surface-roughened. Prior to the surface-roughening of the aluminum plate, a degreasing treatment is performed in order to remove an rolling oil from the surface of the aluminum plate by means of a surfactant, an organic solvent, an aqueous solution of alkali or the like.

The surface-roughening of the aluminum plate may be performed by a variety of methods. Examples of these methods include a method wherein the surface is mechanically roughened, a method wherein the surface is roughened by being electrochemically dissolved and a method wherein the surface is selectively dissolved in a chemical way. Exemplary of the mechanical methods are conventionally known methods such as abrasion by means of balls, abrasion by brushing, abrasion by blasting and abrasion by buffing. Exemplary of the electrochemical methods is immersion of the aluminum plate in an electrolyte solution, such as a hydrochloric acid or anitric acid, while passing an a.c. current or a d.c. current. A combination of a mechanical method and an electrochemical method is also possible as described in JP-A No. 54-63,902.

If necessary, the surface-roughened aluminum plate is subjected to an alkali-etching treatment and a neutralizing treatment. After that, if desired, the aluminum plate is subjected to an anodizing treatment so as to increase the water retention and wear resistance of the surface. A variety of electrolytes capable of producing a porous oxide layer can be used as an electrolyte for use in the anodizing treatment of the aluminum plate. Generally, sulfuric acid, phosphoric acid, oxalic acid, chromic acid or a mixture of these acids is used as the electrolyte. The concentration of the electrolyte may be determined appropriately depending on the type of the electrolyte.

Conditions for the anodizing vary depending on the types of the electrolyte solution employed. However, generally employed conditions are as follows: concentration of the electrolyte solution is 1 to 80% by weight; temperature of the solution is 5 to 70° C.; current density is 5 to 60 A/dm$^2$; voltage is 1 to 100V; and duration of the electrolysis is 10 seconds to 5 minutes.

If the amount of the anodized layer is less than 1.0 g/m$^2$, the surface has a poor plate wear and therefore the non-image areas of a resulting lithographic printing plate are liable to form scratch marks, which collect printing ink in printing operation to produce so-called scratch smudge.

If necessary, the substrate whose surface is anodized may be rendered hydrophilic by a surface treatment. Preferred examples of this surface treatment include treating the surface with an aqueous solution of an alkali metal silicate (such as sodium silicate) as described in U.S. Pat. Nos. 2,714,066; 3,181,461; 3,280,734 and 3,902,734, wherein the substrate is simply immersed or electrolytically treated in an aqueous solution of sodium silicate. Further examples are a treatment of the surface with an aqueous solution of potassium fluorozirconate as described in JP-B No. 36-22,063 and a treatment of the surface with an aqueous solution of polyvinylsulfonic acid as described in U.S. Pat. Nos. 3,276,868; 4,153,461 and 4,689,272.

[Others]

Prior to the coating of the image recording material of the present invention on a substrate, a subbing layer may be formed on the substrate if necessary.

For example, an organic compound constituting the subbing layer is selected from the group consisting of carboxymethyl cellulose, dextrin, gum arabic, phosphonic acids such as 2-aminoethylphophonic acid having an amino group, organic phosphonic acids such as phenylphosphonic acid which may have a substituent, naphthylphosphonic acid, alkylphosphonic acid, glycerophosphonic acid, methylenediphosphonic acid and ethylenediphosphonic acid, organic phosphoric acids such as phenylphosphoric acid which may have a substituent, naphthylphosphoric acid, alkylphosphoric acid and glycerophosphoric acid, organic phosphinic acids such as phenylphosphinic acid which may have a substituent, naphthylphosphinic acid, alkylphosphinic acid and glycerophosphinic acid, amino acids such as glycine and β-alanine, and hydrochloric acid salts of amines having a hydroxyl group such as triethanolamine. These compounds may be used singly or may be used in a combination of two or more. Further, the diazonium compound described previously may also be used as the subbing layer.

The desirable coated amount of the organic subbing layer is in the range of from 2 to 200 mg/m$^2$.

As stated above, a material for a lithographic printing plate can be prepared by using the image recording material of the present invention. Recording on the material for a lithographic printing plate can be performed by means of an infrared laser. Thermal recording by means of an ultraviolet lamp or a thermal head is also possible. In the present invention, it is desirable that the material for a lithographic printing plate be exposed image-wise by means of a solid laser or a semiconductor laser emitting infrared rays having wavelengths of from 760 to 1200 nm.

Details of the mode for using the image recording material of the present invention for the preparation of a lithographic printing plate are described below. The lithographic original plate, which is prepared by coating the image recording material of the present invention on a substrate, may be processed immediately after exposure to a laser. Alternatively, a thermal treatment may be inserted between the exposure and the processing. If the thermal treatment is performed, a desirable condition of the thermal treatment is 60 to 150° C. for 5 seconds to 5 minutes. As for the method for heating in the thermal treatment, conventionally known methods can be employed. Examples of the heating methods include a method wherein the image recording material is heated by contact with a panel heater or a ceramic heater and a method wherein the image recording material is heated in a non-contact state by means of a lamp or a hot air blower. This thermal treatment is effective in decreasing the amount of laser energy required for recording by laser irradiation.

The image recording material of the present invention which is thermally treated if necessary is then processed preferably with water or with an aqueous alkaline solution.

If an alkaline aqueous solution is employed, a conventionally known aqueous alkaline solution can be used as a developing solution and also as a replenisher solution for the processing of the image recording material of the present invention. For example, the aqueous alkaline solution is an aqueous solution of an inorganic alkali salt such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide or lithium hydroxide. In addition, an organic alkaline substance can also be used for the preparation of the aqueous alkaline solution. Examples of the organic alkaline substance include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkaline substances are used singly or in a combination of two or more.

Among these alkaline substances, a particularly preferred example of the developing solution is an aqueous solution of a silicate such as sodium silicate or potassium silicate. This is because the adjustment of developability of a developing solution is possible by varying the ratio of silicon oxide $SiO_2$ to alkali metal oxide $M_2O$, each of which constitutes the silicate, and the concentration of the silicate in the solution. For example, alkali metal silicates described in JP-A No. 54-62,004 and JP-B No. 57-7,427 are effective in the present invention.

In an automated developing machine, a conventionally employed replenishing system makes it possible to process a large amount of material for a lithographic printing plate without exchanging the developing solution in the tank for a long period of time by feeding the tank with an aqueous solution (a replenisher solution) having an alkali strength higher than the developing solution in the tank. This replenishing system is also suitable for use in the present invention.

If necessary, the developing solution and the replenisher solution may contain a surfactant or an organic solvent for such purposes as increase or decrease of developability, dispersion of sludge resulting from development and increase of the hydrophilicity of the image areas of a printing plate. Examples of preferred surfactants include anionic surfactants, cationic surfactants, nonionic surfactants and amphoteric surfactants. Preferred examples of the organic solvent include benzyl alcohol. Other desirable additives are polyethylene glycol or a derivative thereof and polypropylene glycol or a derivative thereof.

Further, if necessary, the developing solution and the replenisher solution may contain such additives as hydroquinone, resorcinol, a reducing agent based on an inorganic salt such as sodium or potassium sulfite or hydrogensulfite, an organic carboxylic acid, a defoaming agent and an agent to convert hard water into soft water.

Examples of the developing solutions containing these surfactants, organic solvents, reducing agents and the like include a developing solution which is described in JP-A No. 51-77,401 and comprises benzyl alcohol, an anionic surfactant, an alkaline substance and water, a developing solution which is described in JP-A No. 53-44,202 and comprises benzyl alcohol, an anionic surfactant and an aqueous solution containing a water-soluble sulfite and a developing solution which is described in JP-A No. 55-155, 355 and comprises an organic solvent having a solubility in water of 10% by weight or less at room temperature, an alkaline substance and water. These developing solutions are also suitable for use in the present invention.

The printing plate after processing with the developing solution and the replenisher solution described above is then subjected to a post-treatment such as a treatment with rinsing water, a treatment with a rinsing solution containing a surfactant or the like, or a treatment with a desensitizing solution containing gum arabic or a starch derivative. A combination of these treatments may be employed as a post-treatment when the image recording material of the present invention is used as a material for a lithographic printing plate.

Recently, for the purpose of rationalization and standardization of plate making operations, automated developing machines are widely used for processing materials for printing plates in the field of plate making and printing industries. Generally, the automated developing machine is made up of a developing part and a post-treating part, each comprising a device for transferring a material for a printing plate together with tanks filled with processing solutions and spraying devices, wherein the material for a printing plate after exposure travels horizontally so that it is processed with the processing solutions which are moved up by means of pumps and sprayed from nozzles. Further, according to a new process, a material for a printing plate is immersed in a processing tank filled with a processing solution by means of immersed guide rolls or the like. In the above-mentioned automated processing, the processing can be performed by supplying replenisher solutions to the processing solutions in accordance with processed volume and operational time.

Further, a so-called non-reuse process, in which a material for a printing plate is processed with a substantially unused processing solution, can also be employed in the present invention.

A lithographic printing plate thus obtained is coated with a desensitizing gum, if necessary, and can be used in a printing operation. However, if it is desired to impart a higher level of wear resistance to the printing plate, the printing plate undergoes a burning treatment.

If the printing plate undergoes the burning treatment, it is desirable to treat the printing plate with a surface-adjusting solution, which is described in, e.g., JP-B Nos. 61-2,518 and 55-28,062 and JP-A Nos. 62-31,859 and 61-159,655, prior to the burning treatment.

According to these treatments, the lithographic printing plate is coated with a surface-adjusting solution by means of sponge or absorbent cotton soaked with the solution; the lithographic printing plate is immersed in a vat filled with a surface-adjusting solution; or the lithographic printing plate is coated with a surface-adjusting solution by means of an automated coater. If the coated amount is homogenized by means of a squeezing device such as squeezing rollers after the coating, a better result is obtained.

The suitable coated amount of the surface-adjusting solution is generally in the range of from 0.03 to 0.8 $g/m^2$ (dry weight).

The lithographic printing plate after the coating of the surface-adjusting solution is heated at a high temperature, if necessary, by means of a burning processor (e.g., Burning Processor BP-1300 manufactured by Fuji Film Co., Ltd.). The temperature and time vary depending on the kinds of the components constituting the image, but desirable temperature and time are 180 to 300° C. and 1 to 20 minutes.

After the burning, if necessary, the lithographic printing plate may be subjected to conventionally employed treatments such as water-rinsing and gum-coating. However, if the surface-adjusting solution contains a water-soluble polymeric compound or the like, a so-called desensitizing treatment such as gum-coating may be omitted.

The lithographic printing plate thus prepared is mounted on an offset printing machine or the like and used for printing a large number of sheets.

EXAMPLES

In order that those skilled in the art will be better able to practice the present invention, the following examples are given by way of illustration and not by way of limitation.

Firstly, examples of the phenol derivative represented by the general formula (I) are described below.

[Synthesis of a phenol derivative [KZ-1] represented by the general formula (I)]

According to the [Reaction formula 1], [KZ-1] was synthesized. That is, 0.1 mol of phenol and an approximately 40% aqueous solution of formalin in an amount corresponding to 1 mol of formalin were emptied into a flask, and a solution was produced. Then, an approximately 50% aqueous solution of dimethylamine in an amount corresponding to 1 mol of dimethylamine was added dropwise to the solution stirred at room temperature. After the completion of the addition, the reaction solution was stirred at 40° C. for 6 hours. The reaction solution was then extracted with ethyl acetate. After the extracted solution was concentrated under a reduced pressure, 2,4,6-tri(dimethylamino)phenol was obtained. The 2,4,6-tri(dimethylamino)phenol obtained was reacted with 1 mol of acetic anhydride at 100° C. for 4 hours, and the excess of the acetic anhydride was removed under a reduced pressure from the reaction product to obtain 2,4,6-tri(acetoxymethyl)phenyl acetate. Further, the 2,4,6-tri(acetoxymethyl)phenyl acetate obtained was reacted with 1 mol of potassium carbonate and 2 mol of ethanol at 80° C. for 5 hours. After the completion of the reaction, the reaction solution was extracted with ethyl acetate. After the extracted solution was concentrated under a reduced pressure, the residue was purified by means of column chromatography, and the desired phenol derivative [KZ-1] was obtained. The purity of the phenol derivative [KZ-1] was 94% according to liquid chromatography. The phenol derivative [KZ-1] was dissolved in methyl ethyl ketone to prepare a 10% solution.

[synthesis of phenol derivatives [KZ-3] and [KZ-4]]

According to the [Reaction formula 2], [KZ-3] and [KZ-4] were synthesized. That is, 0.1 mol of p-cresol, 0.25 mol of potassium hydroxide, paraformaldehyde in an amount corresponding to 0.8 mol of formalin and 150 g of water were emptied into a flask, and a solution was produced. Then, the reaction solution was stirred at 60° C. for 7 hours to complete the reaction. After the reaction, 0.25 mol of ammonium chloride was added to the reaction solution. By filtering off the precipitate, [KZ-3] was obtained. The purity of [KZ-3] thus obtained was 99% according to liquid chromatography. [KZ-3] was then dissolved in methyl ethyl ketone to prepare a 10% solution.

Again, 20 g of [KZ-3] in the form of powder was synthesized. This 20 g of [KZ-3] powder, 1.0 g of concentrated sulfuric acid and 200 g of ethanol were placed in a flask, and the resulting solution was reacted at 80° C. for 4 hours. After the reaction, the sulfuric acid was neutralized with barium carbonate and the insoluble matter was filtered off by means of a micro-filter. In this way, an ethanol solution of [KZ-4] was obtained. The purity of [KZ-4] thus obtained was 86% according to liquid chromatography.

[Synthesis of a phenol derivative [KZ-8]]

[KZ-8] was synthesized as in the synthesis of [KZ-4] according to [Reaction formula 2, and a 10% by weight solution of [KZ-8] in 2-propanol was obtained. The purity of [KZ-8] thus obtained was 83% according to liquid chromatography.

[Synthesis of a binder polymer [BP-2]]

2-(p-hydroxyphenyl)ethyl methacrylate was synthesized by carrying out a dehydration reaction between 2-(p-hydroxyphenyl) ethanol and methacrylic acid in the presence of an acidic catalyst. The 2-(p-hydroxyphenyl)ethyl methacrylate thus obtained was dissolved in 2-methyoxyethanol and subjected to a radical polymerization by use of an azo-based initiator V-601 (manufactured by Wako Pure Chemical Industries, Ltd.). The reaction product was mixed with water and the resulting polymer was precipitated. In this way, a binder polymer [BP-2] was obtained. The weight average molecular weight of the polymer was 56,000 (using polyhydroxystyrene as a standard substance).

[Synthesis of a binder polymer (BP-6)]

P-(N-(3,5-dimethoxyphenyl)aminosulfonyl)styrene was synthesized by carrying out a procedure comprising reacting sodium p-styrenesulfonate with thionyl chloride to prepare p-styrenesulfonyl chloride and then reacting the resulting p-styrenesulfonyl chloride with 3,5-dimethoxyaniline in the presence of pyridine. The P-(N-(3,5-dimethoxyphenyl)aminosulfonyl)styrene thus obtained was dissolved in 2-methyoxyethanol and subjected to a radical polymerization by use of an azo-based initiator V-601 (manufactured by Wako Pure Chemical Industries, Ltd.). The reaction product was mixed with water and the resulting polymer was precipitated. In this way, a binder polymer [BP-6] was obtained. The weight average molecular weight of the polymer was 72,000 (using polyhydroxystyrene as a standard substance).

EXAMPLES 1 TO 5

[Preparation of substrates]

A 0.30 mm thick aluminum plate (type of material: 1050) was degreased with trichloroethylene and sanded with a nylon brush using an aqueous suspension of 400 mesh pumice powder. After being well rinsed with water, the aluminum plate was etched by a process comprising the steps of immersing the aluminum plate in a 25% aqueous solution of sodium hydroxide at 45° C. for 9 seconds, rinsing the aluminum plate with water, immersing the aluminum plate in a 2% aqueous solution of $HNO_3$ for 20 seconds and rinsing the aluminum plate with water. In the process, the etched amount of the sanded aluminum plate was about 3 g/m². After the process, the aluminum plate was subjected to an anodizing process comprising immersing the aluminum plate in a 7% $H_2SO_4$ solution as an electrolyte solution bypassing a d. c. current at a density of 15A/dm². This process produced an anodized film of 3 g/m². Then, the surface-treated aluminum plate was rinsed with water and thereafter dried. The aluminum plate was then coated with a subbing composition given below, and the coating was dried at 80° C. for 30 seconds. After drying, the coated amount was 10 mg/m².

| Subbing composition | |
|---|---|
| β-alanine | 0.1 g |
| phenylphosphonic acid | 0.05 g |
| methanol | 40 g |
| pure water | 60 g |

[Preparation of negative working materials for lithographic printing plates]

Five solutions, namely, [P-1] to [P-5] were prepared according to the formulation of Solution [P] given below by using a corresponding phenol derivative of the present invention. Each of these solutions was coated on the subbing layer of the aluminum plate, and the coating was dried at 100° C. for 1 minute. In this way, negative working materials for lithographic printing plates [P-1] to [P-5] were obtained. After drying, the coated amount was 1.4 g/m².

| Solution [P] | in grams |
|---|---|
| Phenol derivative (a 10% solution shown in Table 1) | 5.0 |
| Binder polymer [BP-1] | 1.5 |
| Acid generating agent [SH-1] | 0.2 |
| Infrared absorber [IK-1] | 0.1 |
| Colorant | 0.015 |
| (AIZEN SPILON BLUE C-RH | |
| (manufactured by Hodogaya Chemical Co., Ltd.) | |
| Fluorine-containing surfactant | 0.06 |
| (Megafac F-177, manufactured by Dainippon Ink | |
| and Chemicals Inc.) | |
| Methyl ethyl ketone | 15 |
| Methyl alcohol | 7 |

The phenol derivatives used in the solutions [P-1] to [P-5] are shown in Table 1. The structures of the acid generating agent [SH-1] and the infrared absorber [IK-1] are given below. The binder polymer [BP-1] was Maruka Linker MS-4P (manufactured by Maruzen Petrochemical Co., Ltd.).

Acid generating agent [SH-1]

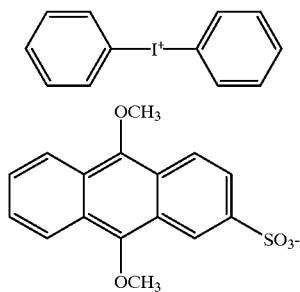

Infrared absorber [IK-1]

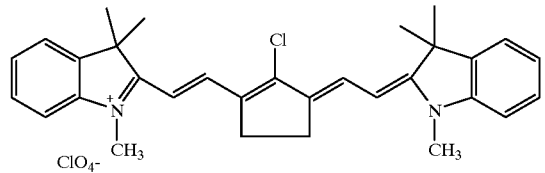

The negative working materials for lithographic printing plates [P-1] to [P-5] were exposed by scanning with a semiconductor laser emitting infrared rays in the wavelength range of from 830 to 850 nm. After the exposure, the exposed plates were thermally treated at 110° C. for 15 seconds by means of a panel heater and then processed with a developing solution DP-4 manufactured by Fuji Film Co., Ltd. (by dilution with water in a ratio of 1:8). Based on the line width of the image obtained, laser output power, loss of the power in the optical system and the scanning speed, the amount of energy required for recording was calculated. The results are shown in Table 10.

TABLE 10

| Example Number | Materials for lithographic printing plates | Phenol derivatives | Amounts of energy required for recording |
|---|---|---|---|
| Example 1 | [P-1] | [KZ-1] | 160 mJ/cm$^2$ |
| Example 2 | [P-2] | [KZ-3] | 190 mJ/cm$^2$ |
| Example 3 | [P-3] | [KZ-4] | 160 mJ/cm$^2$ |
| Example 4 | [P-4] | [KZ-8] | 150 mJ/cm$^2$ |
| Example 5 | [P-5] | Each 2.5 g of [KZ-3] and [KZ-4] | 180 mJ/cm$^2$ |

As seen in Table 10, all of the materials for lithographic printing plates relating to the present invention had a high sensitivity evidenced by the recording energy requirement of 200 mJ/cm$^2$ or less.

COMPARATIVE EXAMPLE 1

Solution [Q-1] was prepared according to the formulation of the solution [P] in Examples 1 to 5, except that the phenol derivative of the present invention as used therein was replaced with the compound [HR-1] having the structure given below. The solution [Q-1] thus prepared was coated on the subbing layer overlying the aluminum plate as in Examples 1 to 5, and the coating was dried at 100° C. for 1 minute. In this way, a negative working material for a lithographic printing plate [Q-1] was obtained. After drying, the coated amount was 1.4 g/m$^2$. The negative working material for a lithographic printing plate [Q-1] was used for image formation as in Examples 1 to 5. The energy amount required for the recording was calculated as 240 mJ/cm$^2$.

Compound [HR-1]

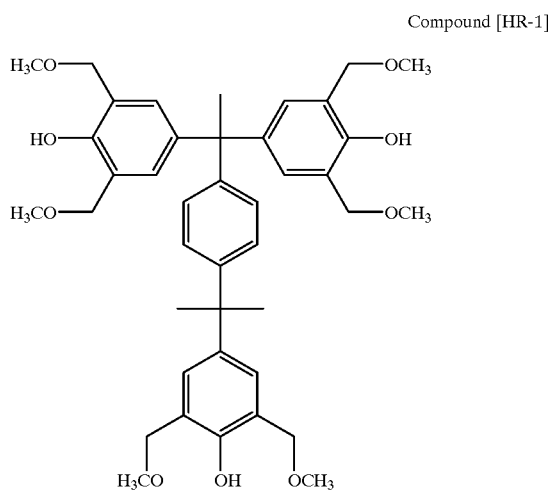

COMPARATIVE EXAMPLE 2

Solution [Q-2] was prepared according to the formulation of the solution [P] in Examples 1 to 5, except that [KZ-3] was used as the phenol derivative and the binder polymer [BP-1] as used therein was replaced with a phenol novolac resin (having a weight average molecular weight of 10,000). The solution [Q-2] thus prepared was coated on the subbing layer overlying the aluminum plate as in Examples 1 to 5, and the coating was dried at 100° C. for 1 minute. In this way, a negative working material for a lithographic printing plate [Q-2] was obtained. After drying, the coated amount was 1.4 g/m$^2$. The negative working material for a lithographic printing plate [Q-2] was used for image formation as in Examples 1 to 5. The energy amount required for the recording was calculated as 260 mJ/cm$^2$.

As is apparent from the results of Examples 1 to 5 and Comparative Examples 1 and 2, the negative working recording materials of the present invention have a higher sensitivity evidenced by the laser-recording energy requirements lower than those for the recording materials of Comparative Examples 1 and 2 which use a conventional cross-linking agent or a conventional binder polymer.

EXAMPLES 6 TO 8

Three solutions, namely, [R-1] to [R-3] were prepared according to the formulation of Solution [R] given below by using a corresponding binder polymer. Each of these solutions was coated on the subbing layer overlying the aluminum plate as in Examples 1 to 5, and the coating was dried at 100° C. for 1 minute. In this way, negative working materials for lithographic printing plates [R-1] to [R-3] were obtained. After drying, the coated amount was 1.4 g/m$^2$.

| Solution [R] | in grams |
|---|---|
| Phenol derivative [KZ-4] (a 10% methanol solution shown) | 5.0 |
| Binder polymer (shown in Table 11) | 1.5 |
| Acid generating agent [SH-2] | 0.4 |
| Infrared absorber [IK-2] | o.1 |
| Colorant | 0.015 |
| (AIZEN SPILON BLUE C-RH | |
| (manufactured by Hodogaya Chemical Co., Ltd.) | |
| Fluorine-containing surfactant | 0.06 |
| (Megafac F-177, manufactured by Dainippon Ink and Chemicals Inc.) | |
| Methyl ethyl ketone | 15 |
| Methyl alcohol | 7 |

The binder polymers used in the solutions [R-1] to [R-3] are shown in Table 11. The structures of the acid generating agent [SH-2] and the infrared absorber [IK-2] are given below.

Acid generating agent [SH-2]

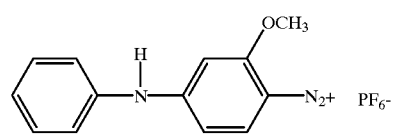

Infrared absorber [IK-2]

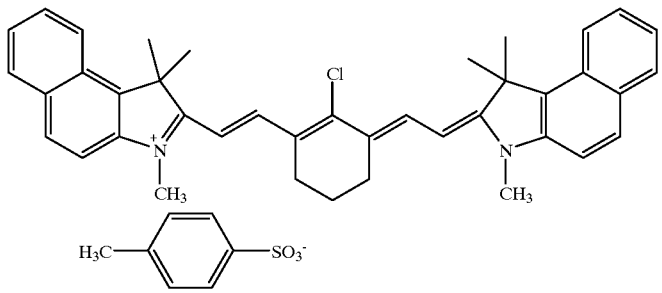

The negative working materials for lithographic printing plates [R-1] to [R-3] thus obtained were used for the image formation as in Examples 1 to 5. And, as in Examples 1 to 5, the amounts of energy required for recording were calculated. The results are shown in Table 11.

TABLE 11

| Example Number | Materials for lithographic printing plates | Binder polymers | Amounts of energy required for recording |
|---|---|---|---|
| Example 6 | [R-1] | [BP-1] | 160 mJ/cm$^2$ |
| Example 7 | [R-2] | [BP-2] | 150 mJ/cm$^2$ |
| Example 8 | [R-3] | [BP-6] | 150 mJ/cm$^2$ |

As seen in Table 11, all of the materials for lithographic printing plates of the present invention, i.e., comprising a combination of the phenol derivative represented by the general formula (I) as a cross-linking agent and a binder polymer having a specific structure, had a high sensitivity evidenced by the recording energy requirement of 200 mJ/cm$^2$ or less.

Details of the example in which a phenol derivative represented by the general formula (II) was used as a cross-linking agent are described below.

[Synthesis of a phenol derivative [A-4] represented by the general formula (II)]

P-aminophenol (1 mol), sodium acetate (1 mol) and acetone (1L) were emptied into a flask, and a solution was produced. Then, isobutyric chloride (1 mol) was added dropwise to the solution stirred and cooled by ice. After the completion of the addition, the reaction solution was stirred for 5 hours at the same temperature. Then, the reaction solution was poured into ice water to deposit crystals. The crystals, namely, A-4-x, were collected by filtration, and the yield was 80%.

A-4-x (0.8 mol), KOH (0.8 mol), water (500 mL) and a 37% aqueous solution of formalin (4.8 mol) were emptied into a flask, and a solution was produced. Then, the reaction solution was stirred at 50° C. for 5 hours. After the reaction, the reaction solution was neutralized with acetic acid, and was then concentrated under a reduced pressure. The oily product thus obtained was dissolved in a 1:1 mixture of ethyl acetate and methanol. The desired product was separated by means of silica gel in a column chromatography. In this way, the desired product A-4 as colorless crystals was obtained in 50% overall yield.

The scheme in synthesis is as follows.

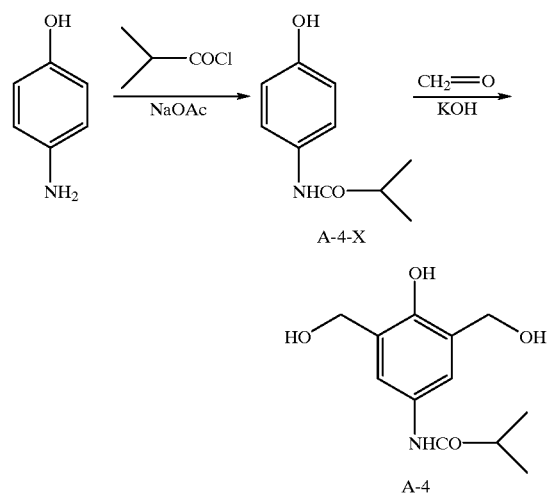

The structure of the product A-4 obtained was confirmed by means of $^1$HNMR, IR and MASS analyses.

[Synthesis of a phenol derivative [D-3]]

Tyramine (1 mol) and acetone (1L) were emptied into a flask, and a solution was produced. Then, phenylisocyanate (1 mol) was added dropwise to the solution stirred at room temperature. After the completion of the addition, the reaction solution was stirred for 3 hours at room temperature. Then, the reaction solution was poured into ice water to deposit crystals. The crystals, namely, D-3-x, were collected by filtration, and the yield was 85%.

D-3-x (0.85 mol), KOH (0.85 mol), water (500 mL) and a 37% aqueous solution of formalin (5.0 mol) were emptied into a flask, and a solution was produced. Then, the reaction solution was stirred at 50° C. for 5 hours. After the reaction, the reaction solution was neutralized with acetic acid, and was then concentrated under a reduced pressure. The crystals thus obtained were dissolved in a 5:5 methanol/water mixture and thereafter recrystallized. The desired product D-3 as colorless powder was obtained in 33% overall yield.

The scheme in synthesis is as follows.

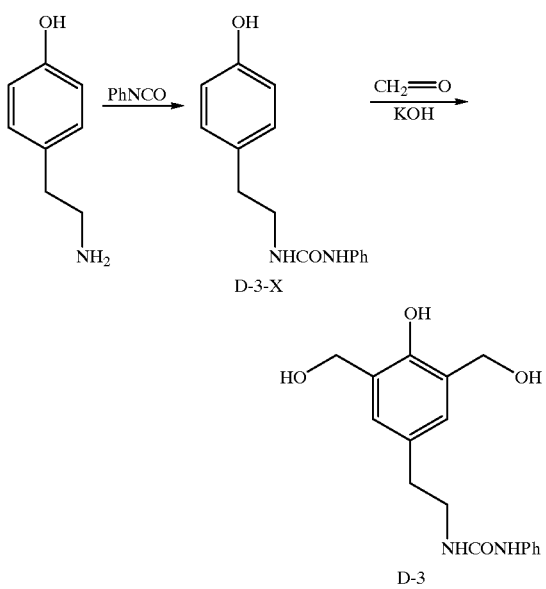

The structure of the product D-3 obtained was confirmed by means of ¹HNMR, IR and MASS analyses.

[Synthesis of a phenol derivative [J-3]]

B-5 (1 mol) obtained in the above-described procedure, isopropyl alcohol (1 L) and sulfuric acid (1 mL) were emptied into a flask, and a solution was produced. Then, the reaction solution was stirred at 70° C. for 1 day. After the reaction, the reaction solution was neutralized with barium carbonate, and the precipitate was filtered off. The filtrate was then concentrated under a reduced pressure. The oily product thus obtained was dissolved in a 9/1 mixture of ethyl acetate/methanol. The desired product was separated by means of silica gel in a column chromatography. In this way, the desired product J-3 as a colorless oily substance was obtained in 70% yield from B-5.

The scheme in synthesis is as follows.

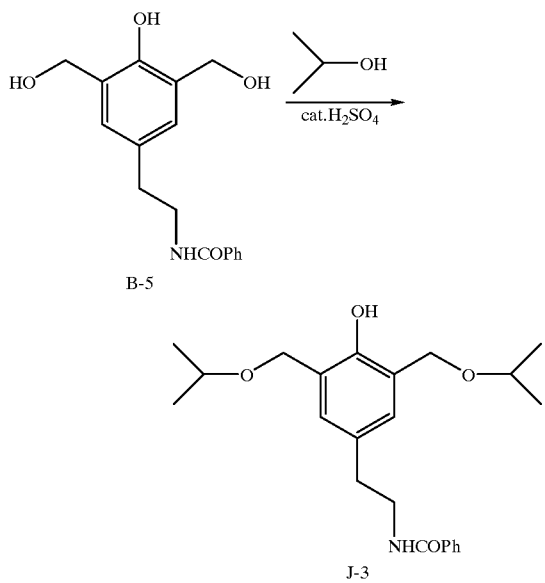

The structure of the product J-3 obtained was confirmed by means of ¹HNMR, IR and MASS analyses.

[Synthesis of a phenol derivative [S-33]]

P-(4-hydroxyphenyl)benzoic acid (1 mol), KOH (2 mol), water (500 mL) and a 37% aqueous solution of formalin (6.0 mol) were emptied into a flask, and a solution was produced. Then, the reaction solution was stirred at 50° C. for 10 hours. After the reaction, the reaction solution was neutralized with acetic acid, and cooled with ice so that crystals deposited. The crystals thus obtained were dissolved in a 5:5 methanol/water mixture and thereafter recrystallized. The desired product S-33 as colorless powder was obtained in 70% overall yield.

The scheme in synthesis is as follows.

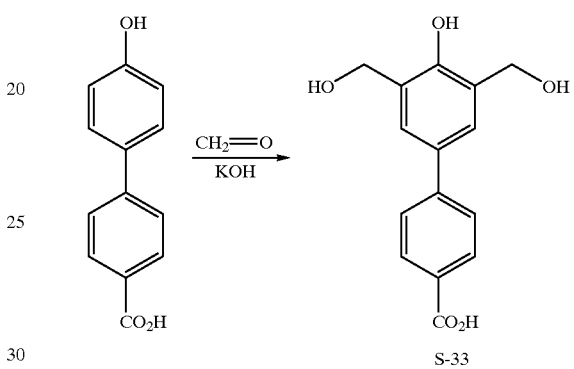

The structure of the product obtained was confirmed by means of ¹HNMR, IR and MASS analyses.

In a similar way, other cross-linking agents could be easily synthesized.

EXAMPLES 9 TO 27

19 solutions, namely, [α-1] to [α-19], were prepared according to the formulation of Solution [α] given below by using a corresponding phenol derivative represented by the general formula (II) of the present invention. The solutions thus prepared were each coated on the subbing layer overlying the aluminum plate (substrate) described previously, and the coating was dried at 100° C. for 1 minute. In this way, negative working materials for lithographic printing plates [α-1] to [α-19] were obtained. After drying, the coated amount was 1.4 g/m².

| Solution [α] | in grams |
|---|---|
| Phenol derivative (a 10% methanol solution shown in Table 12) | 5.0 |
| Binder polymer [BP-1] | 1.5 |
| Acid generating agent [SH-3] | 0.2 |
| Infrared absorber [IK-1] | o.1 |
| Colorant (AIZEN SPILON BLUE C-RH (manufactured by Hodogaya Chemical Co., Ltd.) | 0.015 |
| Fluorine-containing surfactant (Megafac F-177, manufactured by Dainippon Ink and Chemicals Inc.) | 0.06 |
| Methyl ethyl ketone | 15 |
| Methyl alcohol | 7 |

The phenol derivatives used in the solutions [α-1] to [α-19] are shown in Table 12. The structures of the acid generating agent [SH-3] and the infrared absorber [IK-1] are given below. The binder polymer [BP-1] was Maruka Linker MS-4P (manufactured by Maruzen Petrochemical Co., Ltd.).

Acid generating agent [SH-3]

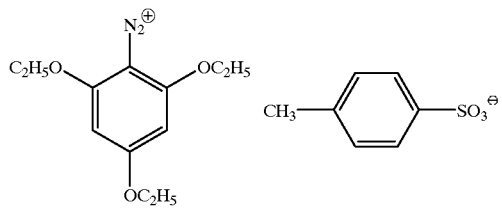

Infrared absorber [IK-1]

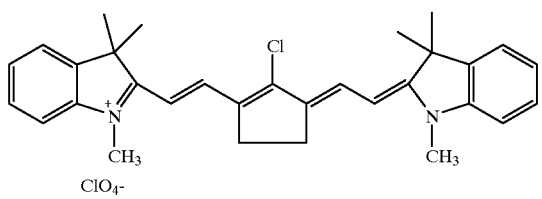

The negative working materials for lithographic printing plates [α-1] to [α-19] were exposed by scanning with a semiconductor laser emitting infrared rays in the wavelength range of from 830 to 850 nm. After the exposure, the exposed plates were thermally treated at 110° C. for 15 seconds by means of a panel heater and then processed with a developing solution DP-4 manufactured by Fuji Film Co., Ltd. (by dilution with water in a ratio of 1:8). Based on the line width of the image obtained, laser output power, loss of the power in the optical system and the scanning speed, the amount of energy required for recording was calculated.

Meanwhile, in order to examine the storability of the materials for lithographic printing plates, the materials for lithographic printing plates before exposure were stored under a highly humid condition (75% RH at 45° C.) for 3 days. After the storage, the materials for lithographic printing plates were laser-exposed in the same way as above. In this way, the difference between the amounts of energy required for recording before and after the storage was examined. If this difference is substantially 20 mJ/cm² or less, the material for a lithographic printing plate is evaluated as desirable in terms of production and as excellent in storability.

These results are shown in Table 12.

TABLE 12

| Example Number | Materials for lithographic printing plates | Phenol derivatives | Amounts of energy required for recording | Change with time in amounts of energy required for recording |
|---|---|---|---|---|
| 9 | [α-1] | A-6 | 160 mJ/cm² | 10 mJ/cm² |
| 10 | [α-2] | B-2 | 160 mJ/cm² | 10 mJ/cm² |
| 11 | [α-3] | C-5 | 175 mJ/cm² | 15 mJ/cm² |
| 12 | [α-4] | D-6 | 175 mJ/cm² | 10 mJ/cm² |
| 13 | [α-5] | E-2 | 165 mJ/cm² | 15 mJ/cm² |
| 14 | [α-6] | F-2 | 170 mJ/cm² | 15 mJ/cm² |
| 15 | [α-7] | G-1 | 175 mJ/cm² | 15 mJ/cm² |
| 16 | [α-8] | H-1 | 160 mJ/cm² | 15 mJ/cm² |
| 17 | [α-9] | J-1 | 180 mJ/cm² | 10 mJ/cm² |
| 18 | [α-10] | S-2 | 165 mJ/cm² | 20 mJ/cm² |
| 19 | [α-11] | S-7 | 160 mJ/cm² | 20 mJ/cm² |
| 20 | [α-12] | S-9 | 165 mJ/cm² | 20 mJ/cm² |
| 21 | [α-13] | S-16 | 155 mJ/cm² | 10 mJ/cm² |
| 22 | [α-14] | S-20 | 160 mJ/cm² | 5 mJ/cm² |
| 23 | [α-15] | S-33 | 180 mJ/cm² | 10 mJ/cm² |
| 24 | [α-16] | S-47 | 155 mJ/cm² | 15 mJ/cm² |
| 25 | [α-17] | S-55 | 155 mJ/cm² | 20 mJ/cm² |
| 26 | [α-18] | S-75 | 155 mJ/cm² | 20 mJ/cm² |
| 27 | [α-19] | S-77 | 180 mJ/cm² | 10 mJ/cm² |

As seen in Table 12, all of the materials for lithographic printing plates of the present invention, each of which comprised a combination of a phenol derivative represented by the general formula (II) as a cross-linking agent and a binder polymer having a specific structure, had a high sensitivity evidenced by the recording energy requirement of 200 mJ/cm² or less. In addition, these materials for lithographic printing plates exhibited a good storability under a highly humid condition.

COMPARATIVE EXAMPLE 3

Solution [β-1] was prepared according to the formulation of the solution [α] in Examples 9 to 27, except that the phenol derivative of the present invention as used therein was replaced with the compound [HR-1] of Comparative Example 1. The solution [β-1] thus prepared was coated on the subbing layer overlying the aluminum plate as in Examples 9 to 27, and the coating was dried at 100° C. for 1 minute. In this way, a negative working material for a lithographic printing plate [β-1] was obtained. After drying, the coated amount was 1.4 g/m$^2$. The negative working material for a lithographic printing plate [β-1] was used for image formation as in Examples 9 to 27. The energy amount required for the recording was calculated as 240 mJ/cm$^2$. Further, as in Examples 9 to 27, the difference between the amounts of energy required for recording before and after the storage under a highly humid condition was examined. This difference was found to be 50 mJ/cm$^2$, thereby indicating a very poor storability.

Example to compare storability

As already stated, the energy amount required for the recording of the material for a negative working lithographic printing plate of Example 2 using a phenol derivative [KZ-3] represented by the general formula (I) of the present invention was calculated as 190 mJ/cm$^2$ indicative of a good sensitivity. Meanwhile, the difference between the amounts of energy required for recording before and after the storage was examined for a negative working material for a lithographic printing plate by using a phenol derivative represented by the general formula (II) under the same condition as in Examples 9 to 27, and the difference was found to be 35 mJ/cm$^2$. Based on this value, it is clear that the use of the phenol derivative represented by the general formula (II) leads to a better storability.

EXAMPLES 28 TO 33

Solutions [δ-1] to [δ-6] were prepared according to the formulation of the solution [α] in Examples 9 to 27, except that phenol derivatives shown in Table 13 for Examples 28 to 33 were used as the phenol derivatives and the binder polymer [BP-1] as used therein was replaced with a phenol novolac resin (having a weight average molecular weight of 13,000). The solutions [δ-1] to [δ-6] thus prepared were evaluated in the same way as above.

TABLE 13

| Example Number | Materials for lithographic printing plates | Phenol derivatives | Amounts of energy required for recording | Change with time in amounts of energy required for recording |
| --- | --- | --- | --- | --- |
| 28 | [δ-1] | A-3 | 180 mJ/cm$^2$ | 10 mJ/cm$^2$ |
| 29 | [δ-2] | B-1 | 175 mJ/cm$^2$ | 10 mJlcm$^2$ |
| 30 | [δ-3] | C-3 | 160 mJ/cm$^2$ | 5 mJ/cm$^2$ |
| 31 | [δ-4] | D-5 | 170 mJlcm$^2$ | 10 mJ/cm$^2$ |
| 32 | [δ-5] | S-23 | 175 mJ/cm$^2$ | 10 mJ/cm$^2$ |
| 33 | [δ-6] | S-61 | 160 mJ/cm$^2$ | 10 mJ/cm$^2$ |

From Table 13, it can be seen that the problem in sensitivity encountered by a combination of the novolac resin and a phenol derivative represented by the general formula (I) as a cross-linking agent can be obviated by a combination of the same novolac resin and a phenol derivative represented by the general formula (II) as a cross-linking agent. This is supported by the fact that the latter combination exhibits a good sensitivity in image formation and a good storability.

These examples illustrate only a few examples of the present invention. Therefore, it will be easy for those skilled in the art to modify the phenol derivatives represented by the general formula (I) or (II) as cross-linking agents by selecting various functional groups and to combine these cross-linking agents with other suitable binder polymers, without departure from the technical concept of the present invention.

The negative working image recording material of the present invention is a negative working recording material comprising (A) a compound which acts as a cross-linking agent in the presence of an acid, (B) a binder polymer, (C) a compound which generates an acid by the action of heat and (D) an infrared absorber, wherein a specific compound described in the appended claims as (A) the compound which acts as a cross-linking agent in the presence of an acid is combined with a specific compound described in the appended claims as (B) the binder polymer. By the use of the combination, the present invention makes it possible to provide a negative working material for a lithographic printing plate which can be used in a direct plate making process using a laser emitting infrared rays and which has a good sensitivity in recording.

What is claimed is:

1. A negative working image recording material comprising (A) a compound which acts as a cross-linking agent in the presence of an acid, (B) a binder polymer, (C) a compound which generates an acid by the action of heat and (D) an infrared absorber, wherein (A) the compound which acts as a crosslinking agent in the presence of an acid is a phenol derivative which is at least one compound selected from the group consisting of the compounds represented by the following structural formulas [KZ-1], [KZ-2], and [KZ-4] to [KZ-8] and (B) the binder polymer is a polymer having as a side chain an aromatic hydrocarbon ring having directly linked thereto a hydroxyl group or an alkoxy group:

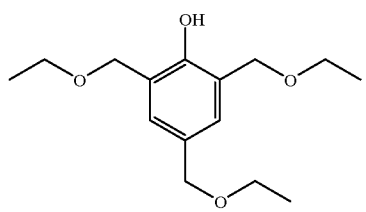

[KZ-1]

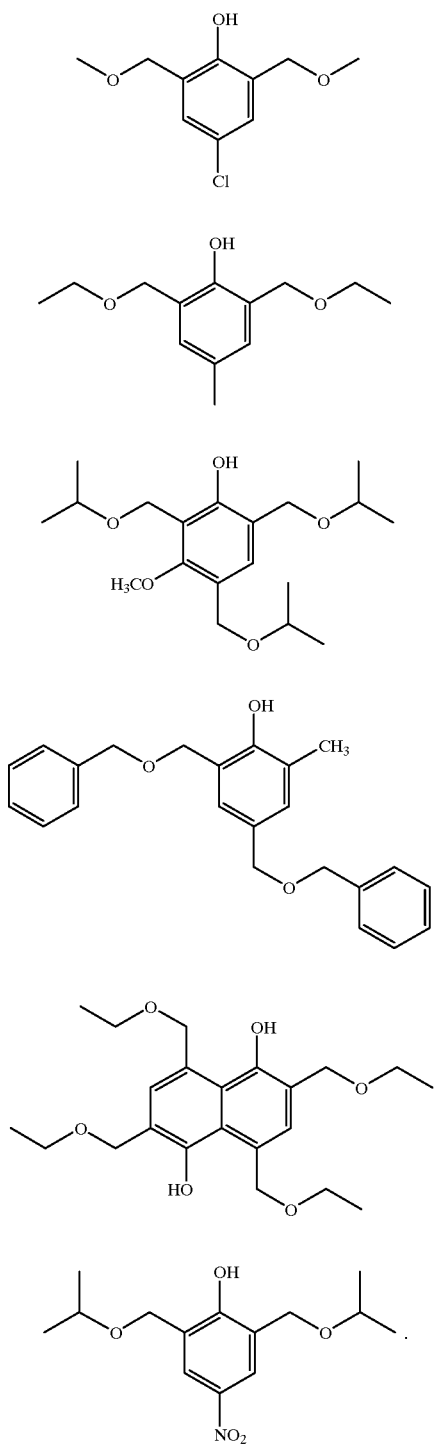

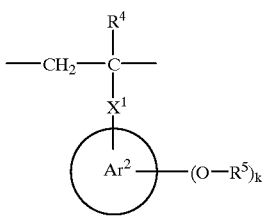

General formula (III)

where $Ar^2$ represents a benzene ring, a naphthalene ring or an anthracene ring; $R^4$ represents a hydrogen atom or a methyl group; $R^5$ represents a hydrogen atom or an alkoxy group having 20 or less carbon atoms; $X^1$ represent a single bond or a divalent linking group having at least one atom selected from the group consisting of C, H, N, O and S together with 0 to 20 carbon atoms; and k is an integer of 1 to 4.

4. A negative working image recording material according to claim 1, wherein (B) the binder polymer has a weight average molecular weight ranging from 5,000 to 300,000 and a number average molecular weight ranging preferably from 1,000 to 250,000.

5. A negative working image recording material according to claim 4, wherein (B) the binder polymer has an index of polydispersity (weight average molecular weight/number average molecular weight) ranging from 1.1 to 10.

6. A negative working image recording material according to claim 1, wherein the content of (B) the binder polymer is in the range of from 20 to 95% by weight based on the weight of the total solids of the image recording material.

7. A negative working image recording material according to claim 1, wherein the content of (C) the compound which generates an acid by the action of heat is in the range of from 0.01 to 50% by weight based on the weight of the total solids of the image recording material.

8. A negative working image recording material according to claim 1, wherein (D) the infrared absorber is a dye or a pigment which effectively absorbs infrared rays in the wavelength range of from 760 to 1200 nm.

9. A negative working image recording material according to claim 1, wherein the content of (D) the infrared absorber is in the range of from 0.01 to 50% by weight based on the weight of the total solids of the image recording material.

10. A negative working image recording material comprising (A) a compound which acts as a cross-linking agent in the presence of an acid, (B) a binder polymer, (C) a compound which generates an acid by the action of heat and (D) an infrared absorber, wherein (A) the compound which acts as a cross-linking agent in the presence of an acid is a phenol derivative which has a low molecular weight indicated by 1000 or less and which has the structure represented by the following general formula (II) and (B) the binder polymer is a polymer having in the side chain or the main chain an aromatic hydrocarbon ring having directly linked thereto a hydroxyl group or an alkoxy group:

2. A negative working image recording material according to claim 1, wherein the content of the phenol derivative is in the range of from 5 to 70% by weight based on the weight of the total solids of the image recording material.

3. A negative working image recording material according to claim 1, wherein (B) the binder polymer is a polymer having the structural unit represented by the following general formula (III):

General formula (II)

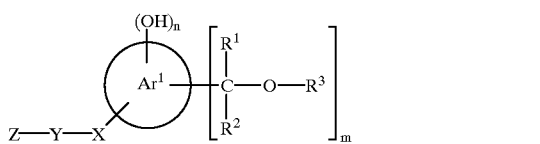

where Ar¹ represents an aromatic hydrocarbon ring which may bear a substituent group; $R^1$ and $R^2$ may be the same or different and each represents a hydrogen atom or a hydrocarbon group having 12 or less carbon atoms; $R^3$ represents a hydrogen atom or a hydrocarbon group having 12 or less carbon atoms; m is an integer of 2 to 4; n is an integer of 1 to 3; X is a divalent linking group and represents a single bond or a hydrocarbon-based linking group which may bear a substituent group; Y represents NRCO, CONR (where R represents a hydrogen atom or alkyl group having 1 to 12 carbon atoms) NHCONH, $NHSO_2$ and $SO_2NH$; and Z is a hydrocarbon-based linking group or a group which may bear a substituent group, and which is present in accordance with the number of groups represented by Y with the proviso that Z is absent if Y is a terminal group.

11. A negative working image recording material according to claim 10, wherein the phenol derivative represented by the general formula (II) is at least one compound selected from the group consisting of the compounds represented by the following structural formula (II-2)

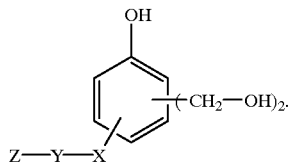

12. A negative working image recording material according to claim 10, wherein the content of the phenol derivative represented by the general formula (II) is in the range of from 5 to 70% by weight, based on the weight of the total solids of the image recording material.

13. A negative working image recording material according to claim 10, wherein (B) the binder polymer has a weight average molecular weight ranging from 5,000 to 300,000 and a number average molecular weight ranging preferably from 1,000 to 250,000.

14. A negative working image recording material according to claim 10, wherein the content of (B) the binder polymer is in the range of from 20 to 95% by weight based on the weight of the total solids of the image recording material.

15. A negative working image recording material according to claim 10, wherein the content of (C) the compound which generates an acid by the action of heat is in the range of from 0.01 to 50% by weight based on the weight of the total solids of the image recording material.

16. A negative working image recording material according to claim 10, wherein (D) the infrared absorber is a dye or a pigment which effectively absorbs infrared rays in the wavelength range of from 760 to 1200 nm.

17. A negative working image recording material according to claim 10, wherein the content of (D) the infrared absorber is in the range of from 0.01 to 50% by weight based on the weight of the total solids of the image recording material.

18. A negative working image recording material according to claim 10, wherein (B) the binder polymer is at least one compound selected from the group consisting of a polymer having the structural units represented by the general formula (III) and a novolac resin, General formula (III)

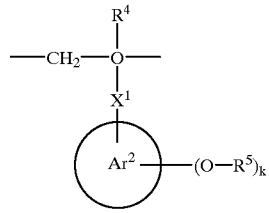

where Ar² represents a benzene ring, a naphthalene ring or an anthracene ring; $R^4$ represents a hydrogen atom or a methyl group; $R^5$ represents a hydrogen atom or an alkoxy group having 20 or less carbon atoms; $X^1$ represents a single bond or a divalent linking group having at least one atom selected from the group consisting of C, H, N, O and S together with 0 to 20 carbon atoms; and k is an integer of 1 to 4.

19. A negative working image recording material according to claim 10 wherein Z in general formula (II) represents straight-chain alkylene or alkyl groups having 1 to 18 carbon atoms, branched alkylene or alkyl groups having 1 to 18 carbon atoms, cyclic alkenylene or alkyl groups having 1 to 18 carbon atoms, arylene or aryl groups having 6 to 20 carbon atoms, straight-chain, branched or cyclic alkenylene or alkenyl groups having 2 to 18 carbon atoms, or alkynylene or alkynyl groups having 2 to 18 carbon atoms.

* * * * *